(12) United States Patent
Lim et al.

(10) Patent No.: US 12,733,159 B2
(45) Date of Patent: Sep. 8, 2026

(54) SEMICONDUCTOR DEVICES

(71) Applicant: Samsung Electronics Co., Ltd., Suwon-si (KR)

(72) Inventors: Juwon Lim, Suwon-si (KR); Younghun Seo, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 490 days.

(21) Appl. No.: 18/448,290

(22) Filed: Aug. 11, 2023

(65) Prior Publication Data

US 2024/0155837 A1 May 9, 2024

(30) Foreign Application Priority Data

Nov. 8, 2022 (KR) ........................ 10-2022-0147521

(51) Int. Cl.
*H10B 12/00* (2023.01)

(52) U.S. Cl.
CPC ........... *H10B 12/50* (2023.02); *H10B 12/033* (2023.02); *H10B 12/05* (2023.02); *H10B 12/315* (2023.02)

(58) Field of Classification Search
CPC ...... H10B 12/00; H10B 12/033; H10B 12/05; H10B 12/315; H10B 12/50
See application file for complete search history.

(56) References Cited

U.S. PATENT DOCUMENTS

| | | | |
|---|---|---|---|
| 10,622,488 B2 | 4/2020 | Rhie | |
| 11,031,405 B2 | 6/2021 | Fardad et al. | |
| 11,289,140 B2 | 3/2022 | Jeong | |
| 11,417,672 B2 | 8/2022 | Lee | |
| 11,469,242 B2 | 10/2022 | Lee | |
| 2021/0012828 A1 | 1/2021 | Kim et al. | |
| 2022/0045045 A1 | 2/2022 | Lee | |
| 2022/0301615 A1* | 9/2022 | Maejima | G11C 5/025 |
| 2022/0344363 A1 | 10/2022 | Lee | |

FOREIGN PATENT DOCUMENTS

| | | |
|---|---|---|
| KR | 20210015445 A | 2/2021 |
| KR | 20210023291 A | 3/2021 |
| KR | 20220018343 A | 2/2022 |
| KR | 10-2022-0043981 A | 4/2022 |

* cited by examiner

*Primary Examiner* — Edward Chin
(74) *Attorney, Agent, or Firm* — Wolf, Greenfield & Sacks, P.C.

(57) ABSTRACT

A semiconductor device includes a BLSA circuit pattern on a substrate, a column circuit pattern on a portion of the substrate adjacent to the BLSA pattern, and a cell array. The cell array includes bit lines extending in a first direction and spaced apart from each other in a second direction on the BLSA circuit pattern and the column circuit pattern, gate electrodes extending in the second direction and spaced apart from each other in the first direction, a gate insulation pattern on a sidewall in the first direction of the gate electrode, a channel on a sidewall in the first direction of the gate insulation pattern and contacting the bit line, a landing pad on the channel, and a capacitor on the landing pad. The BLSA circuit pattern and the column circuit pattern overlap the cell array in a vertical direction.

20 Claims, 34 Drawing Sheets

545
510
490
470
460
440
430
410
310
220
200
180
174
140
100
A'
335
345
355
380
370
360
30
I
154
104
40
236
216
196
II
A
530
525
505
485
460
405
315
286
276
240
296
176
160
156
106
D1
D3
D2

F'
I
III
132
172
B'
B
C'
E'
174
174
174
176
175
134
177
136
A'
174
A
176
213
C
E
160
22
F
30
40
D2
D1
D3

FIG. 10
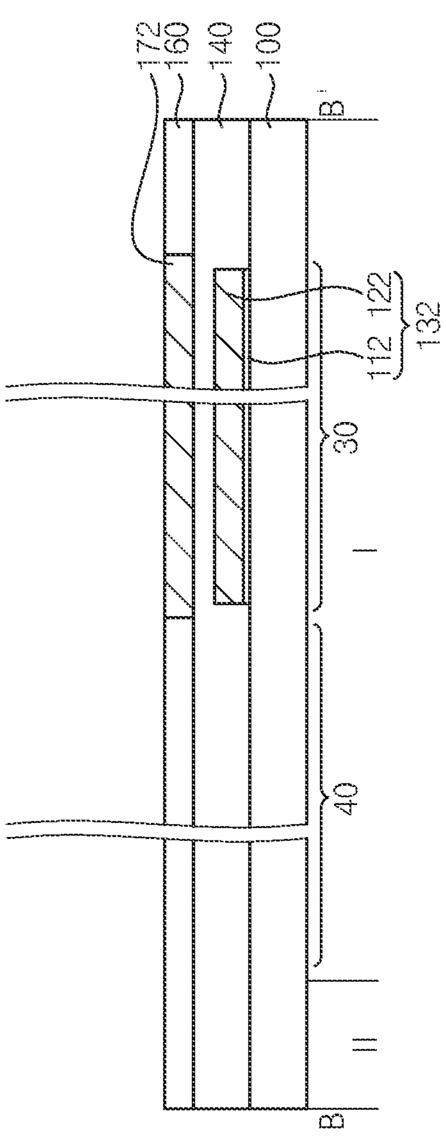
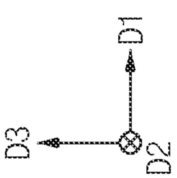

FIG. 11
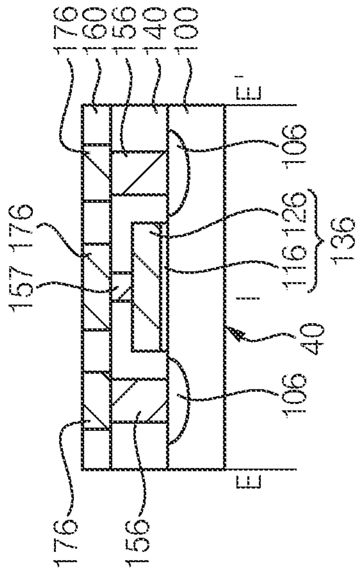
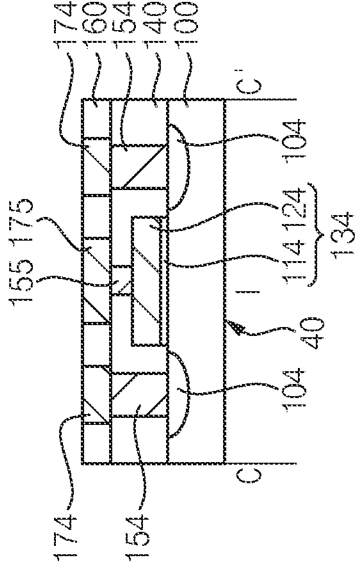
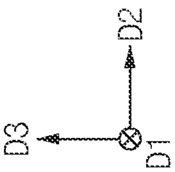

213
233
231
B' 211
A' 174
273
275
271 B
C'
E'
C
E
A
276
240
20
30
40
F
F'
I
III
D1
D2
D3

320
320
320
320
I
II
213
233
273
275
B'
211
231
271
B
174
276
275
213
233
273
275
310
22
30
310
310
40
310
310
D1
D2
D3

350
340
330
310
240
220
211
180
160
140
100
B'
B
231
191
320
122
112
132
30
172
I
281
271
291
40
II
200
D1
D2
D3

310
345
355
320
355
345
I
II
213
211
174
B'
B
273
275
271
276
330
22
30
40
D1
D2
D3

310
335
345
355
380
I
310
213
211
174
273
275
271
276
B'
B
22
30
40
II
D1
D2
D3

310
500
345
355
F'
380
355
345
500
I
380
310
380
500
345
355
380
355
345
500
II
310
213
335
273 335
275
B' 211
B
271
A' 174
A
405
400
275
213
273
275
22
F
30
40
D1
D2
D3

310
500
345
355
380
355
345
500
I
380
310
380
500
345
355
380
355
345
500
II
310
213
335
335
273
275
B'
211
B
271
A'
174
A
405
400
420
275
213
273
275
460
22
30
440
40
460
D1
D2
D3

310
500
345
355
380
355
345
500
I
380
310
380
500
345
355
380
355
345
500
II
335
213
211
213
335
273
275
271
276
545
134
136
174
A'
A
547
C'
C
E'
E
400
420
275
273
275
530
22
30
40
D1
D2
D3

547
527
507
460
487
440
430
407
317
284
274
294
214
180
174
140
100
A'
335
345
355
234
194
380
370
360
30
I
154
104
40
II
530
510
490
470
460
410
310
220
200
180
160
156
106
A
D1
D3
D2

310
500
345
355
F'
380
355
345
500
I
380
310
380
500
345
355
380
355
345
500
II
213
335
335
273
275
B' 211
271 B
275
174
134
136
A' 213
273
A
545
276
400
420
275
213
273
275
530
22
F
30
40
D2
D1
D3

530
510
490
470
460
500
240
220
200
180
172
160
152
140
102
100
F'
400
273
233
213
122
112
132
102
152
275
271
231
211
191
545
174
30
I
380
355
345
335
F
D2
D3
D1

SEMICONDUCTOR DEVICES

CROSS-REFERENCE TO RELATED APPLICATION

This application claims priority under 35 U.S.C. § 119 to Korean Patent Application No. 10-2022-0147521 filed on Nov. 8, 2022, in the Korean Intellectual Property Office, the disclosure of which is hereby incorporated by reference in its entirety.

FIELD

Example embodiments of the present disclosure relate to a semiconductor device. More particularly, example embodiments of the present disclosure relate to a memory device including a vertical channel.

BACKGROUND

Memory devices including vertical channel transistors have been developed. Such memory devices may include memory cells and peripheral circuit patterns for applying electric signals to the memory cells, and methods of effectively disposing the memory cells and the peripheral circuit patterns may be used to increase the integration degree of the memory device.

SUMMARY

Example embodiments provide a semiconductor device having improved characteristics.

According to example embodiments of the inventive concepts, there is provided a semiconductor device. The semiconductor device may include a bit line sense amplifier (BLSA) circuit pattern on a substrate, a column circuit pattern on a portion of the substrate adjacent to the BLSA pattern, and a cell array. The cell array may include bit lines, gate electrodes, gate insulation patterns, channels, landing pads and capacitors. The bit lines may be formed on the BLSA circuit pattern and the column circuit pattern, and each of the bit lines may extend in a first direction substantially parallel to an upper surface of the substrate, and the bit lines may be spaced apart from each other in a second direction substantially parallel to the upper surface of the substrate and crossing the first direction. The gate electrodes may be spaced apart from each other in the first direction, and each of the gate electrodes may extend in the second direction on the bit lines. Each of the gate insulation patterns may be formed on a sidewall in the first direction of a corresponding one of the gate electrodes. Each of the channels may be formed on a sidewall in the first direction of a corresponding one of the gate insulation patterns, and may contact a corresponding one of the bit lines. Each of the landing pads may be formed on a corresponding one of the channels. Each of the capacitors may be formed on a corresponding one of the landing pads. The BLSA circuit pattern and the column circuit pattern may overlap the cell array in a third direction substantially perpendicular to the upper surface of the substrate.

According to example embodiments of the inventive concepts, there is provided a semiconductor device. The semiconductor device may include mats on a substrate and arranged in a first direction substantially parallel to an upper surface of the substrate, a bit line sense amplifier (BLSA) circuit pattern in each of the mats, and a cell array on the BLSA circuit pattern in each of the mats. The cell array may include bit lines, each of which may extend in the first direction, spaced apart from each other in a second direction substantially parallel to the upper surface of the substrate and crossing the first direction, gate electrodes, each of which may extend in the second direction on the bit lines, spaced apart from each other in the first direction, a gate insulation pattern on a sidewall in the first direction of each of the gate electrodes, a channel on a sidewall in the first direction of the gate insulation pattern and contacting a corresponding one of the bit lines, a landing pad on the channel, and a capacitor on the landing pad. The mats may include first mats and second mats, which may be disposed at opposite end portions, respectively, in the first direction. The semiconductor device may further include a column circuit pattern under the cell array in each of the second mats, which may overlap the cell array in a third direction substantially perpendicular to the upper surface of the substrate.

According to example embodiments of the inventive concepts, there is provided a semiconductor device. The semiconductor device may include first and second mats, first bit line sense amplifier (BLSA) circuit patterns, a first cell array, a second BLSA circuit pattern, a column circuit pattern, and a second cell array. The first and second mats may be disposed on a bank region of a substrate including the bank region and a peripheral circuit region. The first and second mats may be arranged in first and second directions substantially parallel to an upper surface of the substrate and crossing each other. The first bit line sense amplifier (BLSA) circuit patterns may be formed at opposing side portions, respectively, in the first direction in each of the first mats. The first cell array may be formed on the first BLSA circuit patterns in each of the first mats. The second BLSA circuit pattern and a column circuit pattern may be formed at opposing side portions, respectively, in the first direction in each of the second mats. The second cell array may be formed on the second BLSA circuit pattern and the column circuit pattern in each of the second mats. The column circuit pattern may overlap the second cell array in a third direction substantially perpendicular to the upper surface of the substrate.

In the semiconductor device in accordance with example embodiments, some of the peripheral circuit patterns may be formed in a space of a mat adjacent to the peripheral circuit region, which is free of a BLSA circuit pattern, so as to increase the integration degree of the semiconductor device.

BRIEF DESCRIPTION OF THE DRAWINGS

FIGS. 8, 9, 10, 11, 12, 13, 14, 15, 16, 17, 18, 19, 20, 21, 22, 23, 24, 25, 25, 27, 28, and 29 are plan views and cross-sectional views illustrating a method of manufacturing a semiconductor device in accordance with example embodiments.

DETAILED DESCRIPTION OF EMBODIMENTS

The above and other aspects and features of a semiconductor device and a method of manufacturing the same in accordance with example embodiments will become readily understood from detail descriptions that follow, with reference to the accompanying drawings. It will be understood that, although the terms "first," "second," and/or "third" may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second or third element, component, region, layer or section without departing from the teachings of inventive concepts. Spatially relative terms, such as "under," "below," "lower," "over," "above," "upper," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "under" other elements or features would then be oriented "above" or "over" the other elements or features. Thus, the term "below" can encompass both an orientation of above and below. The device may be otherwise oriented (rotated 90 degrees or at other orientations), and the spatially relative descriptors used herein may be interpreted accordingly. When an element is referred to as being "on" or "connected to" another element, it can be directly on or connected to the other element, or intervening elements may be present. In contrast, when an element is referred to as being "directly on" or "directly connected to" another element, there are no intervening elements present. The terms "comprises," "comprising," "includes" and/or "including," when used herein, specify the presence of stated elements, but do not preclude the presence of additional elements. The term "and/or" includes any and all combinations of one or more of the associated listed items.

Hereinafter, in the specification (and not necessarily in the claims), two horizontal directions substantially parallel to an upper surface of a substrate may be referred to as first and second directions D1 and D2, respectively, and a vertical direction substantially perpendicular to the upper surface of the substrate may be referred to as a third direction D3. In example embodiments, the first and second directions are substantially perpendicular to each other.

Figure 1:
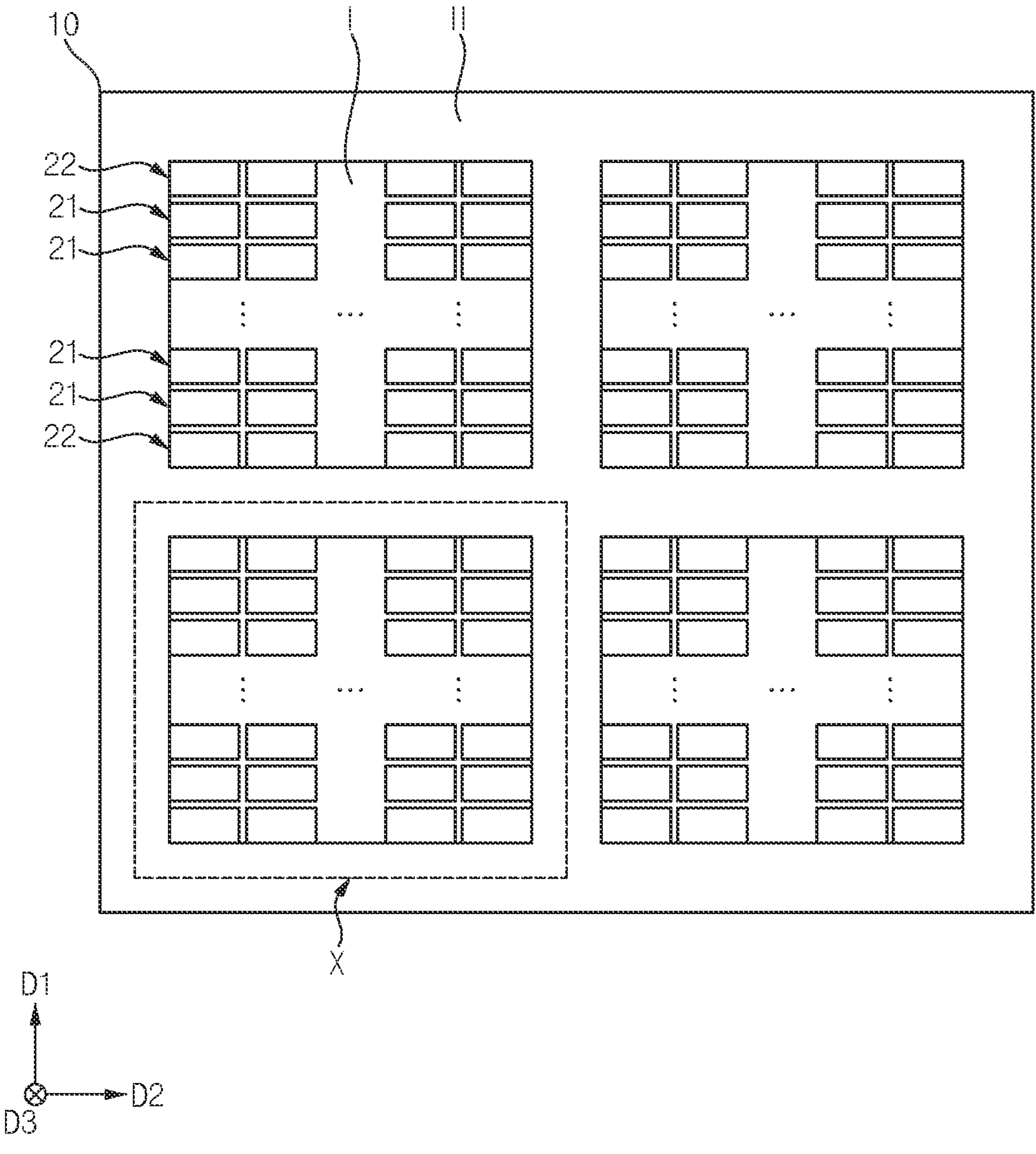
FIGS. 1, 2, 3, 4, 5, 6, and 7 are plan views and cross-sectional views illustrating a semiconductor device according to example embodiments.
Figure 2:
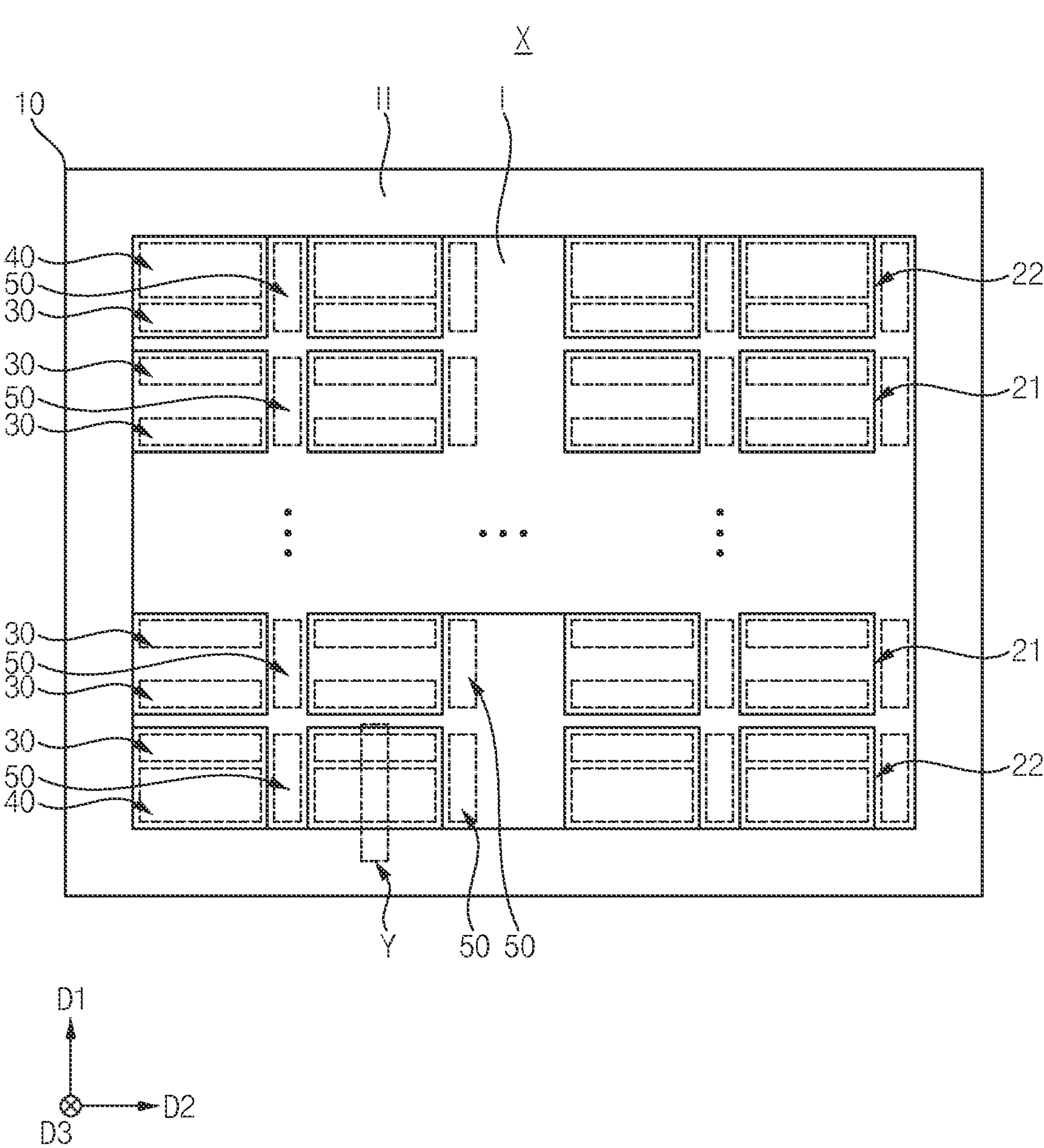
Figure 3:
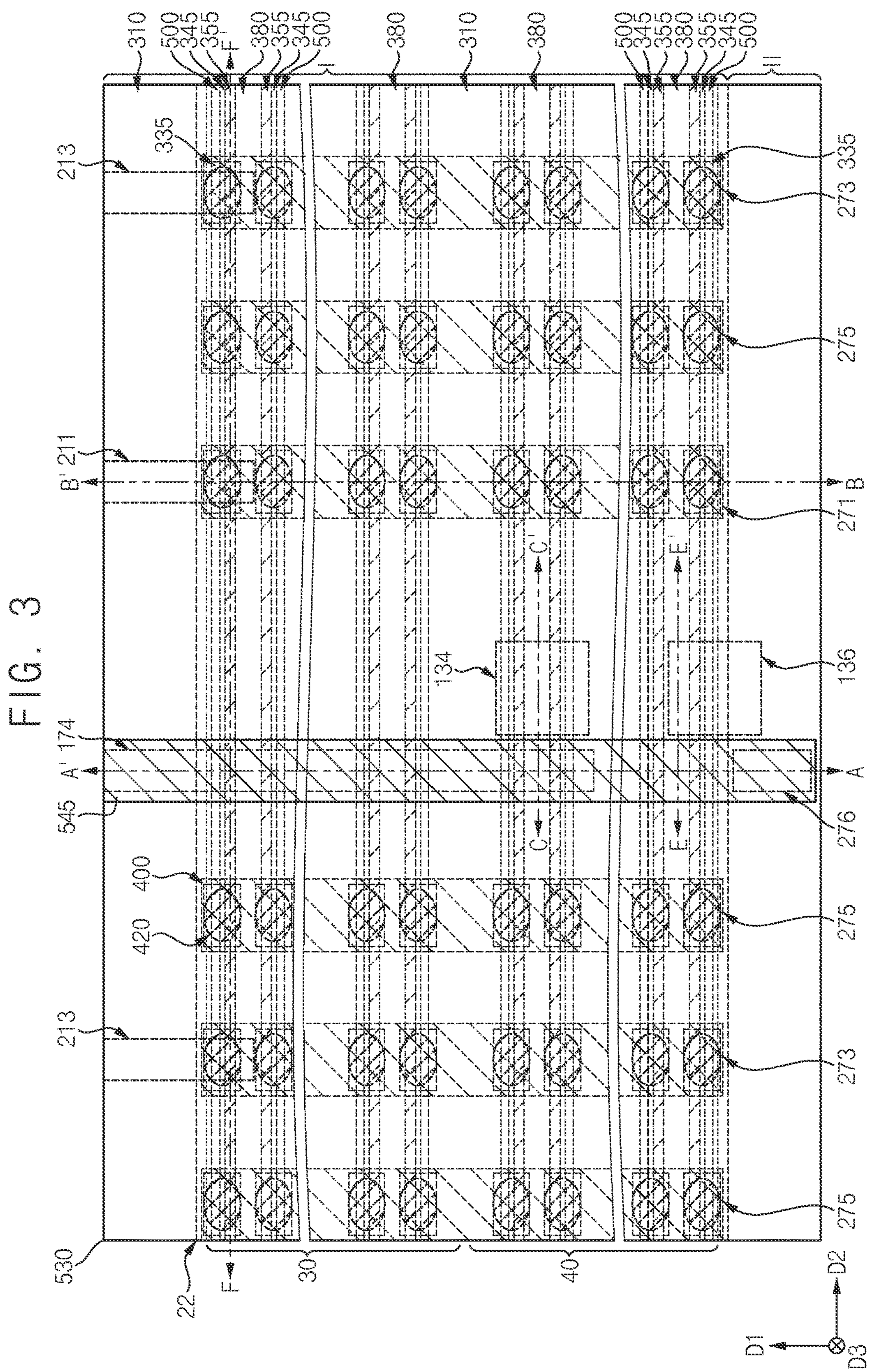
Figure 4:
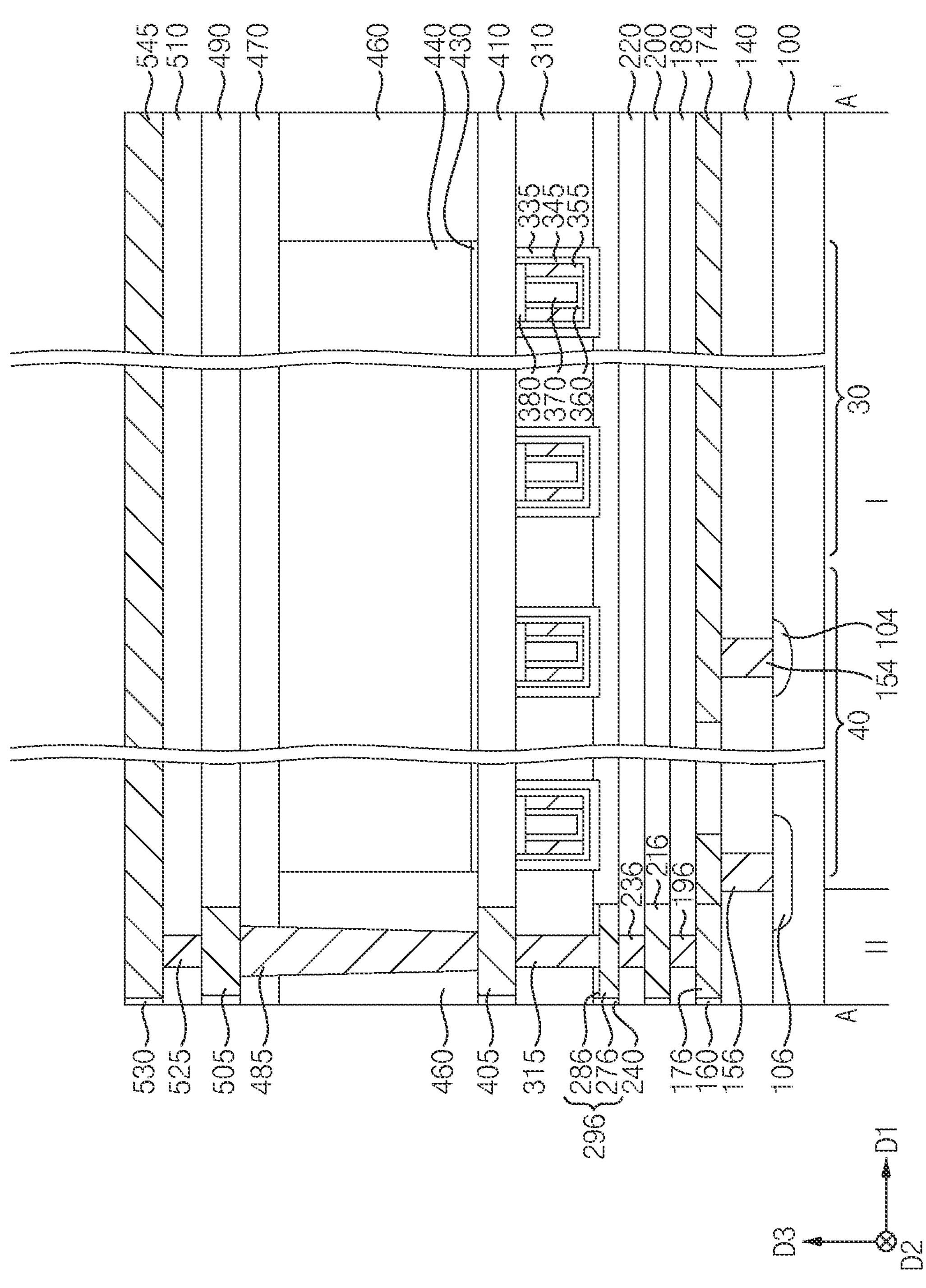
Figure 5:
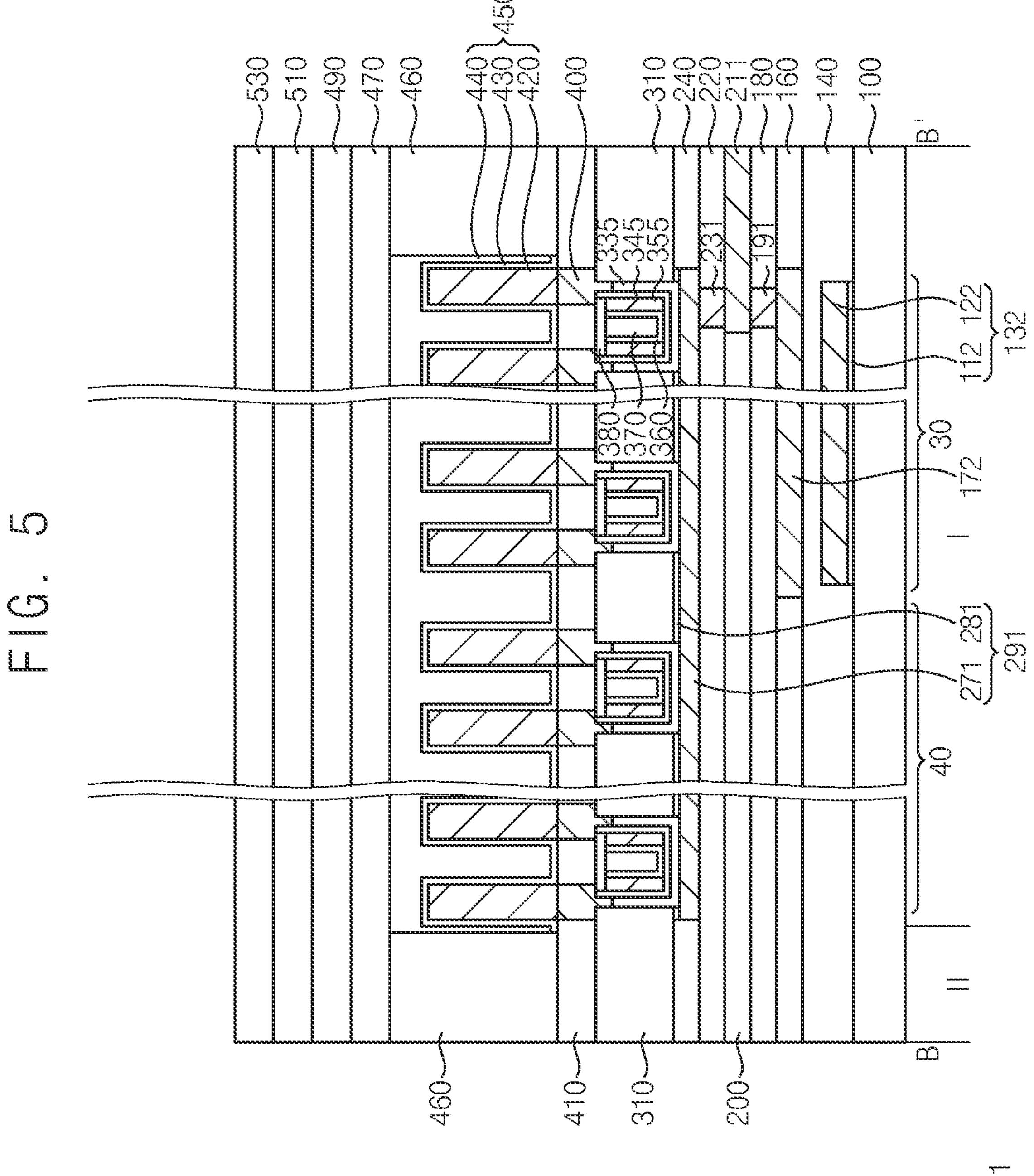
Figure 6:
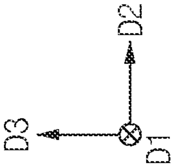
Figure 7:
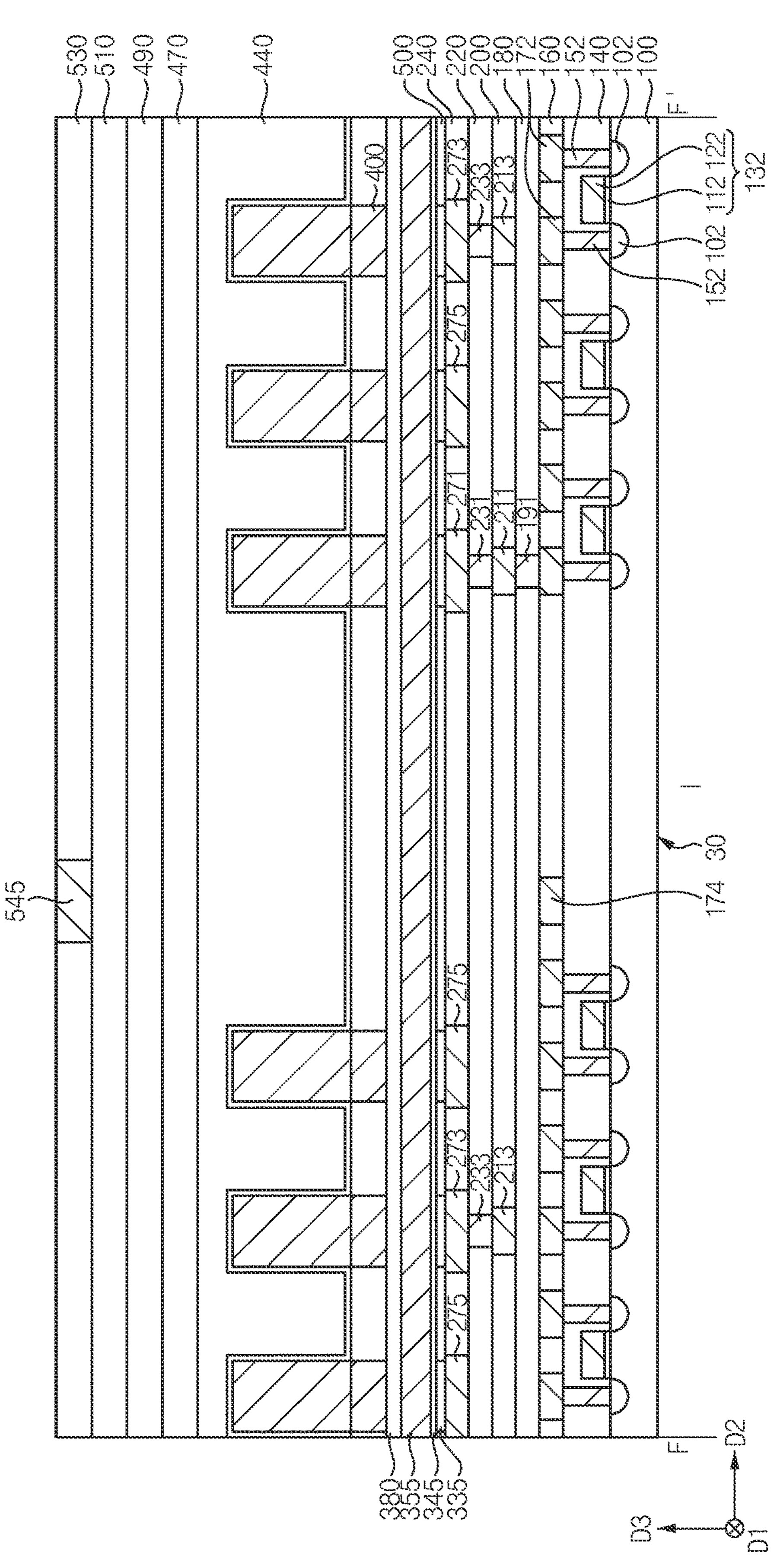
Figure 8:
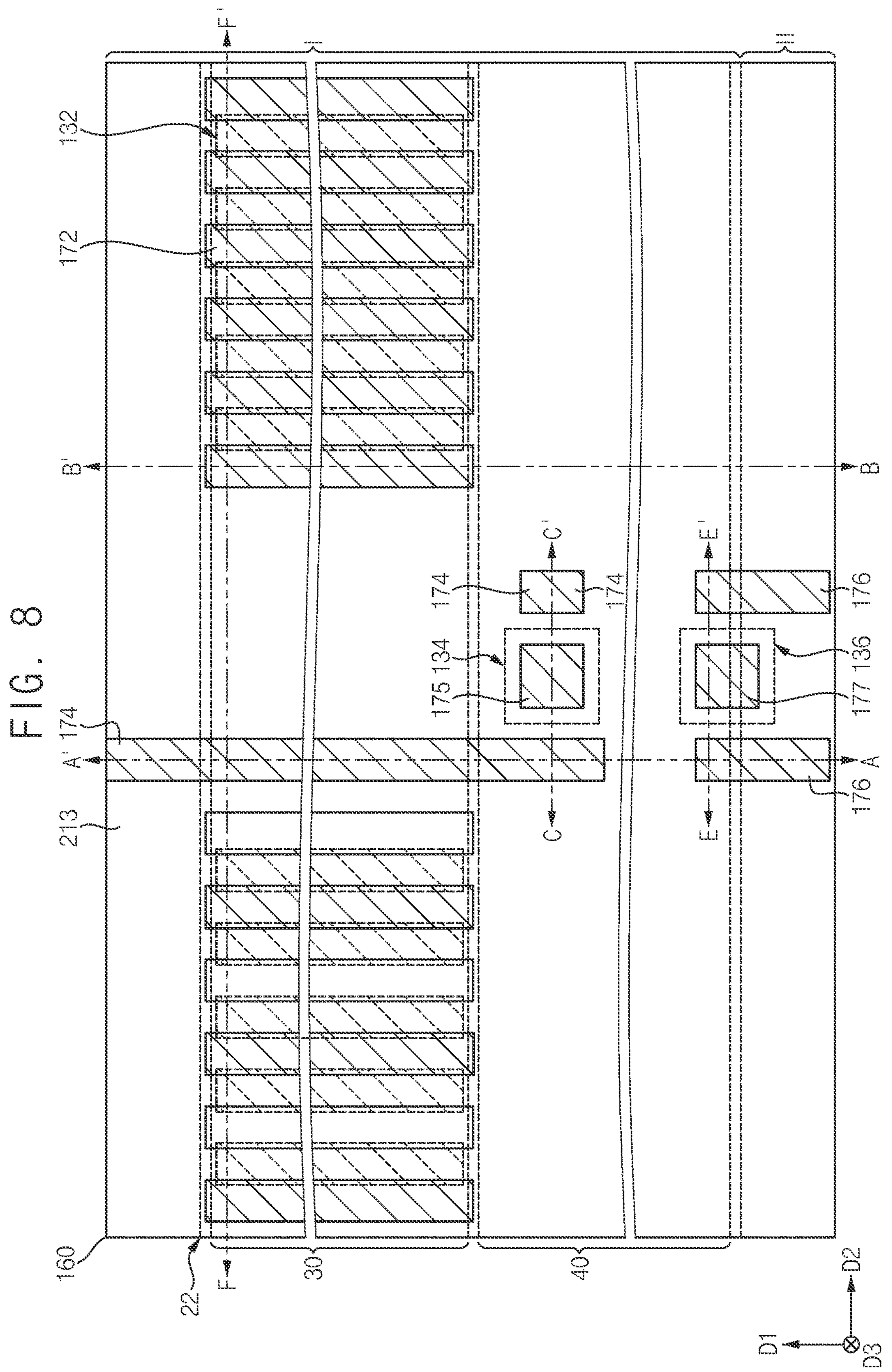

FIGS. 1 to 7 are plan views and cross-sectional views illustrating a semiconductor device according to example embodiments. Particularly, FIGS. 1 to 3 are the plan views, FIG. 4 is a cross-sectional view taken along line A-A' of FIG. 3, FIG. 5 is a cross-sectional view taken along line B-B' of FIG. 3, FIG. 6 includes cross-sectional views taken along lines C-C' and E-E', respectively, of FIG. 3, and FIG. 7 is a cross-sectional view taken along line F-F'.

FIG. 2 is an enlarged plan view of region X of FIG. 1, FIG. 3 is an enlarged plan view of region Y of FIG. 2, and FIGS. 4 to 7 are cross-sectional views of region Y of FIG. 2.

Referring to FIG. 1, a semiconductor device 10 may include first and second regions I and II.

In example embodiments, the first region I may be a bank region in which memory cells are formed, and the second region II may be a peripheral region in which peripheral circuit patterns for applying electric signals to the memory cells are formed.

In example embodiments, a plurality of first regions I may be spaced apart from each other in the first and second directions D1 and D2, and the second region II may surround the first regions I. FIG. 1 shows that the semiconductor device 10 includes four first regions I, however, the inventive concept may not be limited thereto.

Referring to FIG. 2, a plurality of mats in which cell arrays are formed, respectively, may be spaced apart from each other in the first and second directions D1 and D2 in each of the first regions I.

In example embodiments, the mats may include second mats 22, which may be adjacent to the second region II in the first direction D1, and first mats 21, which may be other mats.

In example embodiments, a sub word line driver (SWD) region 50 in which a SWD for applying electric signals to word lines included in the cell array is disposed may be disposed at a side in the second direction D2 of each of the first and second mats 21 and 22.

The semiconductor device 10 may have a cell over periphery (COP) structure in which the cell array is formed on lower circuit patterns.

Thus, in example embodiments, a bit line sense amplifier (BLSA) region 30 in which a BLSA circuit pattern is formed may be disposed at each of opposite or opposing side portions in the first direction D1 of each of the first mats 21. Additionally, in example embodiments, a column circuit region 40 in which some of the peripheral circuit patterns, e.g., a column circuit pattern is formed may be disposed at a side portion of each of the second mats 22 adjacent to the second region II in the first direction D1, and the BLSA region 30 may be disposed at another side portion in the first direction D1 of each of the second mats 22.

In example embodiments, a column circuit pattern such as a column decoder, a column select line (CSL) driver, an input/output sense amplifier (I/O SA), a write driver, etc., may be formed in the column circuit region 40.

Referring to FIGS. 3 to 7, the semiconductor device may include lower circuit patterns on a substrate 100, a cell array on the lower circuit pattern, a first upper wiring structure 296, a second landing pad 405, first and second upper contact plugs 315 and 485, a first upper via 525, and second and third upper wirings 505 and 545.

The cell array may include first to third bit line structures 291, 293 and 295, an upper gate electrode 355, an upper gate insulation pattern 345, a channel 335, a first landing pad 400 and a capacitor 450.

Additionally, the semiconductor device may include first to fifth lower insulating interlayers 140, 160, 180, 200 and 220, first to fifth upper insulating interlayer patterns 240, 310, 370, 410 and 460, sixth to ninth upper insulating interlayers 470, 490, 510 and 530, and first to seventh insulation patterns 281, 283, 285, 286, 360, 380 and 500.

The substrate 100 may include, e.g., a semiconductor material, an insulating material, a conductive material, etc.

The lower circuit patterns may include, e.g., transistors, lower contact plugs, lower vias, lower wirings, etc. FIGS. 3 to 7 show first to third transistors, first to third lower contact plugs 152, 154 and 156, fifth and sixth lower contact plugs 155 and 157, first to fifth lower vias 191, 196, 231, 233 and 236, and first to eighth lower wirings 172, 174, 176, 175, 177, 211, 213 and 216, however, the inventive concept may not be limited thereto.

In example embodiments, the first transistor may be formed in the BLSA region 30, and may be a part of a BLSA circuit pattern. Additionally, the second transistor may be formed in the column circuit region 40, and may be a part of, e.g., a CSL driver circuit pattern.

The third transistor may be formed in the column circuit region 40 and the second region II, and may be a part of, e.g., an I/O SA circuit pattern or a write driver circuit pattern. At least a portion of the third transistor may be formed in the column circuit region 40, and other portions of the third transistor may be formed in the second region II.

A transistor that may be a part of, e.g., a column decoder circuit pattern may be further formed in the column circuit region 40. The column decoder circuit pattern may include an SRAM device for storing repair information and a comparator circuit pattern, and thus, when a repaired column address is input, a redundancy source may be used.

The first transistor may include a first lower gate structure 132 and first impurity regions 102 at upper portions, respectively, of the substrate 100 that may be disposed at opposite sides, respectively, in the second direction D2 of the first lower gate structure 132, the second transistor may include a second lower gate structure 134 and second impurity regions 104 at upper portions, respectively, of the substrate 100 that may be disposed at opposite sides, respectively, in the second direction D2 of the second lower gate structure 132, and the third transistor may include a third lower gate structure 136 and third impurity regions 106 at upper portions, respectively, of the substrate 100 that may be disposed at opposite sides, respectively, in the second direction D2 of the third lower gate structure 136.

The first lower gate structure 132 may include a first lower gate insulation pattern 112 and a first lower gate electrode 122 stacked in the third direction D3, the second lower gate structure 134 may include a second lower gate insulation pattern 114 and a second lower gate electrode 124 stacked in the third direction D3, and the third lower gate structure 136 may include a third lower gate insulation pattern 116 and a third lower gate electrode 126 stacked in the third direction D3.

Each of the first to third impurity regions 102, 104 and 106 may include, e.g., silicon doped with n-type impurities. Each of the first to third lower gate insulation patterns 112, 114 and 116 may include an oxide, e.g., silicon oxide and/or a metal oxide. The first to third lower gate electrodes 122, 124 and 126 may include, e.g., a metal, a metal nitride, a metal silicide, etc.

In an example embodiment, the first lower gate structure 132 may extend in the first direction D1 in the BLSA region 30. Alternatively, a plurality of first lower gate structures 132 may be spaced apart from each other in the first direction D1 in the BLSA region 30.

In example embodiments, a plurality of first lower gate structures 132 may be spaced apart from each other in the second direction D2 in the BLSA region 30, and thus a plurality of first transistors may be spaced apart from each other in the second direction D2 in the BLSA region 30.

Additionally, a plurality of second transistors may be spaced apart from each other in the first direction D1 or in the second direction D2 in the column circuit region 40, and a plurality of third transistors may be spaced apart from each other in the first direction D1 or in the second direction D2 in the column circuit region 40 and the second region II.

The first lower insulating interlayer 140 may be formed on the substrate 100, and may cover the first to third transistors. The first to third lower contact plugs 152, 154 and 156 may extend through the first lower insulating interlayer 140 to contact upper surfaces of the first to third impurity regions 102, 104 and 106, respectively, and the fifth and sixth lower contact plugs 155 and 157 may extend through the first lower insulating interlayer 140 to contact upper surfaces of the second and third lower gate structures 134 and 136, respectively. A fourth lower contact plug may extend through the first lower insulating interlayer 140 to contact an upper surface of the first lower gate structure 132.

The second lower insulating interlayer 160 may be formed on the first lower insulating interlayer 140, the first to third lower contact plugs 152, 154 and 156, and the fifth and sixth lower contact plugs 155 and 157. The first to fifth lower wirings 172, 174, 176, 175 and 177 may extend through the second lower insulating interlayer 160 to contact upper surfaces of the first, second, third, fifth and sixth lower contact plugs 152, 154, 156, 155 and 157, respectively.

In example embodiments, each of the first lower wirings 172 may extend in the first direction D1 in the BLSA region 30.

In example embodiments, at least one of the second lower wirings 174 on the second lower contact plugs 154, respectively, and being electrically connected to the second transistor may serve as a CSL, and may extend in the first direction D1 in the column circuit region 40 and the BLSA region 30. Further, in an example embodiment, the at least one of the second lower wirings 174 may extend through the first and second mats 21 and 22 disposed in the first direction D1 continuously in the first direction D1.

As the plurality of second transistors are formed, a plurality of second lower wirings 174, each of which may be electrically connected to a corresponding one of the second transistors and serves as the CSL, may be spaced apart from each other in the second direction D2.

In example embodiments, at least one of the third lower wirings 176 on the third lower contact plugs 156, respectively, may extend in the first direction D1 from the column circuit region 40 to the second region II.

The third lower insulating interlayer 180 may be formed on the second insulating interlayer 160 and the first to fifth lower wirings 172, 174, 176, 175 and 177. The first and second lower vias 191 and 196 may extend through the third lower insulating interlayer 180 to contact upper surfaces of the first and third lower wirings 172 and 176, respectively.

In example embodiments, the first lower via 191 may be formed on one of the first lower wirings 172 disposed in the second direction D2. Additionally, the second lower via 196 may be formed in the second region II.

The fourth insulating interlayer 200 may be formed on the third lower insulating interlayer 180 and the first and second lower vias 191 and 196. The sixth and eighth lower wirings 211 and 216 may extend through the fourth lower insulating interlayer 200 to contact upper surfaces of the first and second lower vias 191 and 196, respectively, and the seventh lower wiring 213 may extend through the fourth lower insulating interlayer 200 to overlap one of the first lower wirings 172 in the third direction D3. Components or layers described with reference to "overlap" in a particular direction may be at least partially obstructed by one another when viewed along a line extending in the particular direction or in a plane perpendicular to the particular direction.

In example embodiments, each of the sixth and seventh lower wirings 211 and 213 may extend in the first direction D1 not only in the BLSA region 30 included in the second mat 22 but also in the BLSA region 30 included in one of the first mats 21 adjacent to the second mat 22 in the first direction D1 and in a portion of the first region I between the first and second mats 21 and 22. The seventh lower wiring 213 may contact an upper surface of the first lower via 191 in the BLSA region 30 included in the one of the first mats 21 adjacent to the second mat 22 in the first direction D1.

The eighth lower wiring 216 may be formed in the second region II.

The fifth insulating interlayer 220 may be formed on the fourth lower insulating interlayer 200 and the sixth to eighth lower wirings 211, 213 and 216. The third to fifth lower vias 231, 233 and 236 may extend through the lower insulating interlayer 220 to contact upper surfaces of the sixth to eighth lower wirings 211, 213 and 216, respectively.

In example embodiments, the sixth lower wiring 211 may contact a lower surface of the third lower via 231 in the BLSA region 30 included in the first mat 21 adjacent in the first direction D1.

In example embodiments, the fifth lower via 236 may be formed in the second region II.

The first to third lower contact plugs 152, 154 and 156, the fifth and sixth lower contact plugs 155 and 157, the first to fifth lower vias 191, 196, 231, 233 and 236, and the first to eighth lower wirings 172, 174, 176, 175, 177, 211, 213 and 216 may include, e.g., a metal, a metal nitride, a metal silicide, etc., and the first to fifth lower insulating interlayers 140, 160, 180, 200 and 220 may include an insulating material, e.g., silicon oxide, silicon nitride, etc.

The first upper insulating interlayer pattern 240 may be formed on the fifth lower insulating interlayer 220 and the third to fifth lower vias 231, 233 and 236. The first to third bit line structures 291, 293 and 295 and the first upper wiring structure 296 may extend through the first upper insulating interlayer pattern 240.

The first bit line structure 291 may include a first bit line 271 and a first insulation pattern 281 stacked in the third direction D3, the second bit line structure 293 may include a second bit line 273 and a second insulation pattern 283 stacked in the third direction D3, and the third bit line structure 295 may include a third bit line 275 and a third insulation pattern 285 stacked in the third direction D3. Additionally, the first upper wiring structure 296 may include a first upper wiring 276 and a fourth insulation pattern 286 stacked in the third direction D3.

In example embodiments, each of the first to third bit line structures 291, 293 and 295 may extend in the first direction D1 in the BLSA region 30 and the column circuit region 40. The first bit line structure 291 may contact an upper surface of the third lower via 231, and the second bit line structure 293 may contact an upper surface of the fourth lower via 233. The third bit line structure 295 may overlap in the third direction D3 one of the first lower wirings 172 that does not overlap in the third direction D3 the third lower via 231 or the fourth lower via 233.

The first bit line 271 included in the first bit line structure 291 may be electrically connected to the first transistor, which may compose a BLSA circuit, through the third lower via 231, the sixth lower wiring 211, the first lower via 191 and the first lower wiring 172.

The second bit line 273 included in the second bit line structure 293 may be electrically connected to the fourth lower via 233 and the seventh lower wiring 213. The seventh lower wiring 213 may contact an upper surface of the first lower via 191 in the BLSA region 30 included in the first mat 21 adjacent in the first direction D1, and may be electrically connected to the first transistor, which may compose a BLSA circuit, through the first lower via 191.

That is, the first bit line 271 may be electrically connected to the BLSA circuit in the BLSA region 30 included in the second mat 22, and the second bit line 273 may be electrically connected to the BLSA circuit in the BLSA region 30 included in the first mat 21 adjacent to the second mat 22 in the first direction D1.

The third bit line 275 included in the third bit line structure 295 may not be electrically connected to the BLSA circuit, and thus may be a dummy bit line.

In example embodiments, the first to third bit line structures 291, 293 and 295 may be alternately and repeatedly arranged in the second direction D2, however, the order of the arrangement is not limited.

The first upper wiring structure 296 may be formed in the second region II, and may contact an upper surface of the fifth lower via 236.

The first to third bit lines 271, 273 and 275 and the first upper wiring 276 may include a conductive material, e.g., a metal, a metal nitride, a metal silicide, etc., and the first to fourth insulation patterns 281, 283, 285 and 286 may include an insulating material, e.g., silicon nitride.

The second upper insulating interlayer pattern 310 may extend in the second direction D2 on the first to fourth insulation patterns 281, 283, 285 and 286 and the first upper insulating interlayer pattern 240. The second upper insulating interlayer pattern 310 may include an oxide, e.g., silicon oxide.

Hereinafter, the second insulating interlayer pattern 310, and the first to third insulation patterns 281, 283 and 285 and an upper portion of the first upper insulating interlayer pattern 240 at the same level as the first to third insulation patterns 281, 283 and 285 under the second insulating interlayer pattern 310 may be collectively referred to as a bar structure. The bar structure may extend in the second direction D2, and a plurality of bar structures may be spaced apart from each other in the first direction D1. A second opening 320 (refer to FIG. 17) extending in the second direction D2 and exposing upper surfaces of the first to third bit lines 271, 273 and 275 and the first upper insulating interlayer pattern 240 may be formed between the bar structures.

The channel 335 may be formed between the bar structures, and a plurality of channels 335 may be spaced apart from each other in the second direction D2 on the first to third bit lines 271, 273 and 275 and the first upper insulating interlayer pattern 240. The seventh insulation pattern 500 may be formed between neighboring ones of the channels 335 in the second direction D2. The seventh insulation pattern 500 may include an oxide, e.g., silicon oxide, or an insulating nitride, e.g., silicon nitride.

Additionally, a plurality of channels 335 may be spaced apart from each other in the first direction D1 on each of the first to third bit lines 271, 273 and 275.

In example embodiments, the channel 335 may be formed on upper surfaces of the first to third bit lines 271, 273 and 275 and a sidewall of the bar structure, and may have a constant thickness. Thus, in example embodiments, a cross-section of the channel 335 in the first direction D1 may have a shape of a cup. Alternatively, the cross-section of the channel 335 in the first direction D1 may have a shape of an "L" shape.

In example embodiments, the channel 335 may include an oxide semiconductor material. The oxide semiconductor material may include zinc tin oxide (ZTO), indium zinc oxide (IZO), zinc oxide ($ZnO_x$), indium gallium zinc oxide (IGZO), indium gallium silicon oxide (IGSO), Indium oxide ($InO_x$, $In_2O_3$), tin oxide ($SnO_2$), titanium oxide ($TiO_x$), zinc oxide nitride ($Zn_xOyN_z$), magnesium zinc oxide ($Mg_xZn_yO_z$), indium zinc oxide ($In_xZn_yO_a$), indium gallium zinc oxide ($In_xGa_yZn_zO_a$), zirconium indium zinc oxide ($Zr_xIn_yZn_zO_a$), hafnium indium zinc oxide ($Hf_xIn_yZn_zO_a$), tin indium zinc oxide ($Sn_xIn_yZn_zO_a$), aluminum tin indium zinc oxide ($Al_xSn_yIn_zZn_aO_d$), silicon indium zinc oxide ($Si_xIn_yZn_zO_a$), zinc tin oxide ($Zn_xSn_yO_z$), aluminum zinc tin oxide ($Al_xZn_ySn_zO_a$), gallium zinc tin oxide ($Ga_xZn_ySn_zO_a$), zirconium zinc tin oxide ($Zr_xZn_ySn_zO_a$), and/or indium gallium silicon oxide (InGaSiO).

In example embodiments, the channel 335 may include an amorphous oxide semiconductor material. In example embodiments, an upper surface of the channel 335 may be lower than an upper surface of the bar structure. Alternatively, the upper surface of the channel 335 may be substantially coplanar with the upper surface of the bar structure.

The third upper insulating interlayer pattern 370 may extend in the second direction D2 on a portion of the channel 335 on the first to third bit lines 271, 273 and 275 and the first upper insulating interlayer pattern 240 between the bar structures, and a lower surface and a sidewall of the third upper insulating interlayer pattern 370 may be covered by the fifth insulation pattern 360. A cross-section of the fifth insulation pattern 360 in the first direction D1 may have a shape of a cup, and may contact an upper surface and/or a sidewall of the portion of the channel 335 on the first to third bit lines 271, 273 and 275 and the first upper insulating interlayer pattern 240.

The third upper insulating interlayer pattern 370 may include an oxide, e.g., silicon oxide, and the fifth insulation pattern 360 may include an insulating nitride, e.g., silicon nitride.

The upper gate insulation pattern 345 and the upper gate electrode 355 may be formed between a portion of the channel 335 on a sidewall of the bar structure and the fifth insulation pattern 360.

The upper gate electrode 355 may contact an outer sidewall of the fifth insulation pattern 360, and may extend in the second direction D2. An upper surface of the upper gate electrode 355 may be substantially coplanar with upper surfaces of the third upper insulating interlayer pattern 370 and the fifth insulation pattern 360. The upper gate electrode 355 may include a conductive material, e.g., a metal, a metal nitride, a metal silicide, etc. In an example embodiment, a cross-section of the upper gate electrode 355 may have an "I" shape.

The upper gate insulation pattern 345 may cover a lower surface and an outer sidewall of the upper gate electrode 355, and may extend in the second direction D2. Additionally, the upper gate insulation pattern 345 may contact a portion of an inner sidewall of the channel 335 on the side of the bar structure, a sidewall of a lower portion of the upper contact plug 400, and an inner lower surface of the portion of the channel 335 on the first to third bit lines 271, 273 and 275 and the first upper insulating interlayer pattern 240. Thus, a cross-section of the upper gate insulation pattern 345 in the first direction D1 may have a shape of a cup.

In example embodiments, an upper surface of the upper gate insulation pattern 345 may be substantially coplanar with an upper surface of the second upper insulating interlayer pattern 310. The upper gate insulation pattern 345 may include a metal oxide, e.g., aluminum oxide, hafnium oxide, zirconium oxide, etc., or silicon oxide.

The sixth insulation pattern 380 may extend in the second direction D2 on the third insulating interlayer pattern 370, the fifth insulation pattern 360 and the upper gate electrode 355. The sixth insulation pattern 380 may contact upper surfaces of the third upper insulating interlayer pattern 370, the fifth insulation pattern 360 and the upper gate electrode 355, and an upper inner sidewall of the upper gate insulation pattern 345.

In example embodiments, an upper surface of the sixth insulation pattern 380 may be substantially coplanar with an upper surface of the upper gate insulation pattern 345 or an upper surface of the second insulating interlayer pattern 310. The sixth insulation pattern 380 may include an insulating nitride, e.g., silicon nitride.

The first upper contact plug 315 may extend through the second insulating interlayer pattern 310 and the fourth insulation pattern 286 to contact an upper surface of the first upper wiring 276 in the second region II.

The first landing pad 400 may contact the upper surface of the channel 335 at each of areas where the first to third bit lines 271, 273 and 275 and the upper gate electrodes 355 cross each other. The first landing pad 400 may also contact upper surfaces of the upper gate insulation pattern 345, the second upper insulating interlayer pattern 310 and the sixth insulation pattern 380 adjacent to the channel 335. The first landing pad 400 may not contact an upper surface of the upper gate electrode 355, but may be spaced apart from the upper gate electrode 355 by the sixth insulation pattern 380 and the gate insulation pattern 345.

In example embodiments, the first landing pad 400 may include the lower portion in a second recess, which may be formed between the second upper insulating interlayer pattern 310 included in the bar structure and the upper gate insulation pattern 345, and an upper portion. The upper portion of the first landing pad 400 may have an area greater than an area of the lower portion thereof, in a plan view.

In example embodiments, a plurality of first landing pads 400 may be spaced apart from each other in the first and second directions D1 and D2 in the BLSA region 30 and the column circuit region 40, and may be arranged in a honeycomb pattern or a lattice pattern in a plan view.

The second landing pad 405 may be formed in the second region II, and may contact an upper surface of the first upper contact plug 315.

The first and second landing pads 400 and 405 may include a conductive material, e.g., a metal, a metal nitride, a metal silicide.

The fourth upper insulation pattern 410 may be formed on the second insulating interlayer pattern 310, the channel 335, the upper gate insulation pattern 345 and the sixth insulation pattern 380, and may cover sidewalls of the first and second landing pads 400 and 405. The fourth upper insulating interlayer pattern 410 may include an oxide, e.g., silicon oxide.

The capacitor 450 may include first and second capacitor electrodes 420 and 440 and a dielectric layer 430 therebetween. The first capacitor electrode 420 may be formed on the first landing pad 400, the dielectric layer 430 may be formed on an upper surface and a sidewall of the first capacitor electrode 420 and an upper surface of the fourth upper insulating interlayer pattern 410, and the second capacitor electrode 440 may be formed on the dielectric layer 430.

As the plurality of first landing pads 400 are spaced apart from each other in the first and second directions D1 and D2 in the BLSA region 30 and the column circuit region 40, a plurality of first capacitor electrodes 420 may be spaced apart from each other in the first and second directions D1 and D2.

In example embodiments, the first capacitor electrode 420 may have a shape of a circle, an ellipse, a polygon, a polygon with rounded corners, etc., in a plan view. The first capacitors 420 may be arranged in a lattice pattern or a honeycomb pattern in a plan view.

The capacitor 450 may be formed in each of the first and second mats 21 and 22, and the fifth upper insulating interlayer pattern 460 may be formed on the fourth upper insulating interlayer pattern 410 in other regions, that is, in the second region II and a portion of the first region I between the first and second mats 21 and 22, and may surround the capacitor 450.

The sixth upper insulating interlayer 470 may be formed on the capacitor 450 and the fifth upper insulating interlayer pattern 460, and the second upper contact plug 485 may extend through the sixth upper insulating interlayer 470 and the fifth upper insulating interlayer pattern 460 to contact an upper surface of the second landing pad 405 in the second region II.

The seventh insulating interlayer 490 may be formed on the sixth upper insulating interlayer 470 and the second upper contact plug 485, and the second upper wiring 505 may extend through the seventh upper insulating interlayer 490 to contact an upper surface of the second upper contact plug 485 in the second region II.

The eighth upper insulating interlayer 510 may be formed on the seventh upper insulating interlayer 490 and the second upper wiring 505, and the first upper via 525 may extend through the eighth upper insulating interlayer 510 to contact an upper surface of the second upper wiring 505 in the second region II.

The ninth upper insulating interlayer 530 may be formed on the eighth upper insulating interlayer 510 and the first upper via 525, and the third upper wiring 545 may extend through the ninth upper insulating interlayer 530 to contact an upper surface of the third upper via 525.

In example embodiments, the third upper wiring 545 may serve as a global I/O line, and may extend in the first direction D1 in the second region II, the column circuit region 40 and the BLSA region 30. Further, the third upper wiring 545 may extend through the first and second mats 21 and 22 disposed in the first direction D1, and may continuously extend in the first direction D1.

The third transistor, which may be part of the I/O SA circuit pattern or the write driver circuit pattern, may be electrically connected to the third upper wiring 545, which may serve as the global I/O line, through the third contact plug 156, the third lower wiring 176, the second lower via 196, the eighth lower wiring 216, the fifth lower via 236, the first upper wiring 276, the first upper contact plug 315, the second landing pad 405, the second upper contact plug 485, the second upper wiring 505 and the first upper via 525.

As the plurality of third transistors are formed, a plurality of third upper wirings 545, which may be electrically connected to the third transistors and serve as the global I/O line, may be spaced apart from each other in the second direction D2.

FIGS. 3 to 7 show that the third upper wiring 545 overlaps the second lower wiring 174 in the third direction D3, however, the inventive concept may not be limited thereto.

The sixth to ninth insulating interlayers 470, 490, 510 and 530 may include an insulating material, e.g., silicon oxide, silicon nitride, etc. The first and second upper contact plugs 315 and 485, the first upper via 525, and the second and third upper wirings 505 and 545 may include a conductive material, e.g., a metal, a metal nitride, a metal silicide, etc.

In the semiconductor device, current may flow in the third direction D3, that is, in the vertical direction in the channel 335 between the first and second third bit lines 271, 273 and 275 and the first landing pad 400, and thus the semiconductor device may be a vertical channel transistor (VCT) DRAM device.

In the VCT DRAM device having a COP structure, the BLSA circuit pattern may be formed under a cell array, and may be commonly connected to a pair of bit lines, that is, a bit line and a bit line bar, each of which may extend in the first direction D1, disposed at opposite sides, respectively, in the first direction D1. Thus, unlike the first mat 21 including the BLSA circuit patterns at opposite side portions, respectively, in the first direction D1, the second mat 22, which may be disposed at an edge portion in the first direction D1 in the first region I, may not include the BLSA circuit pattern at a side portion adjacent to the peripheral circuit region, that is, the second region II so that an empty space may remain at the side portion of the second mat 22.

In the semiconductor device in accordance with example embodiments, the BLSA region 30 may be formed at each of opposite side portions in the first direction D1 of the first mat 21, however, the BLSA region 30 may be formed at a first side portion of the second mat 22 adjacent to the first mat 21 in the first direction D1, while the column circuit region 40 may be formed at a second side portion of the second mat 22 adjacent to the second region II in the first direction D1. Various peripheral circuit patterns that may be formed in the second region II, e.g., column decoders, CSL drivers, I/O SAs, write driver, etc., may be formed in the column circuit region 40, and thus the empty space may be effectively used so as to increase the integration degree of the semiconductor device.

Figure 9:
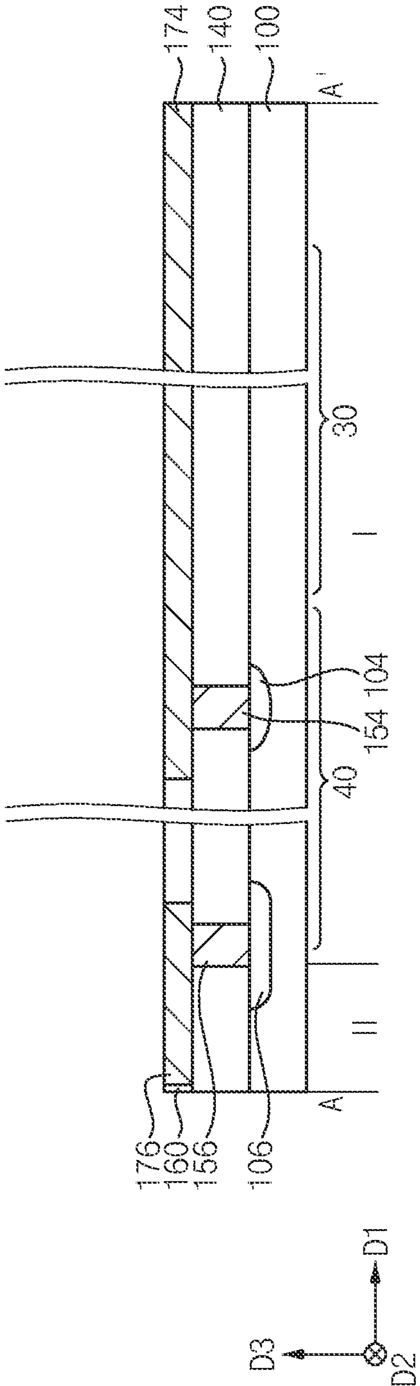
Figure 12:
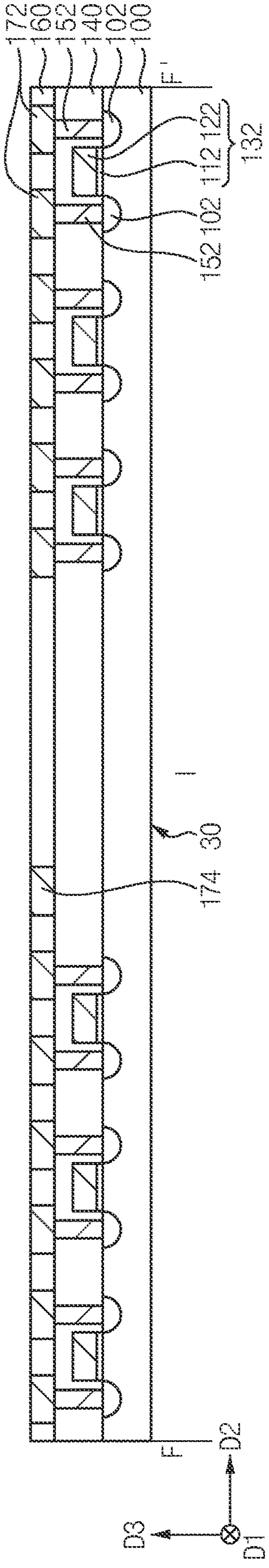
Figure 13:
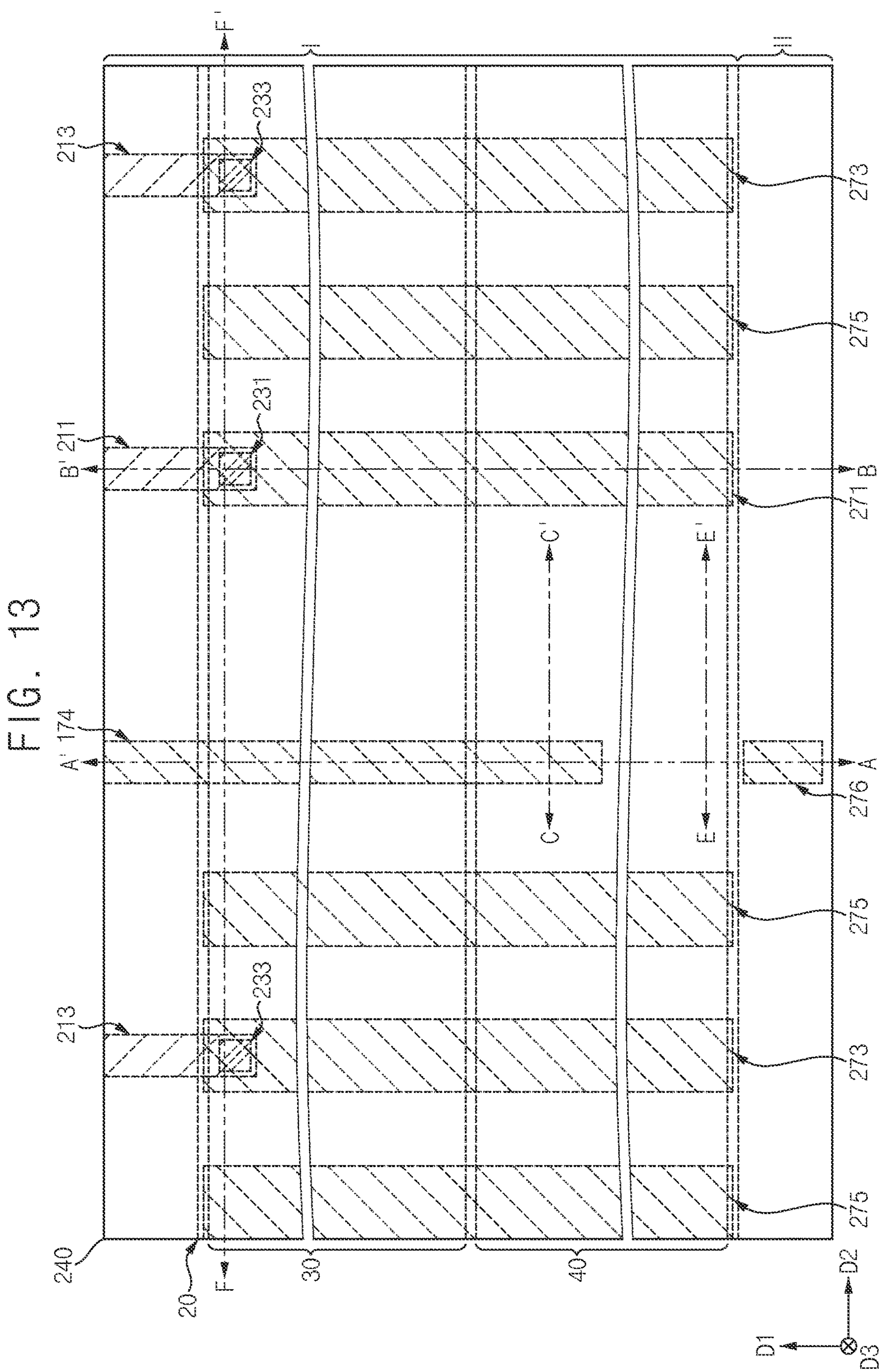
Figure 14:
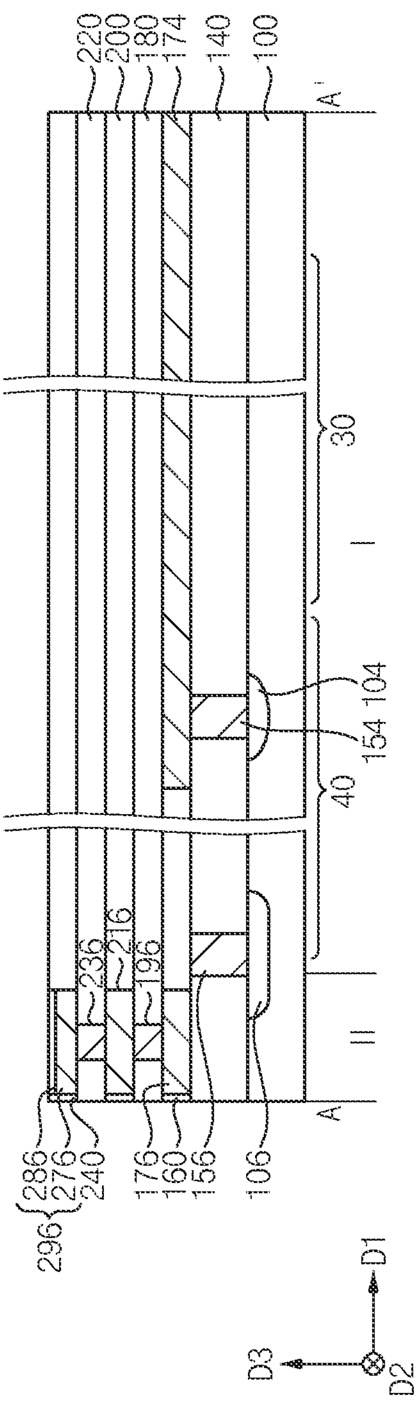
Figure 15:
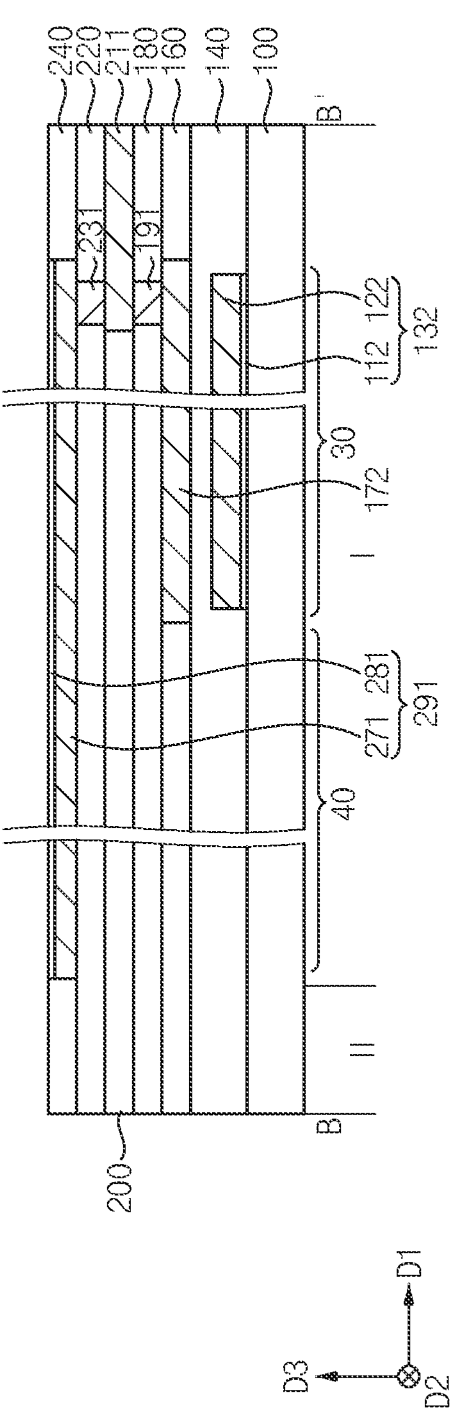
Figure 16:
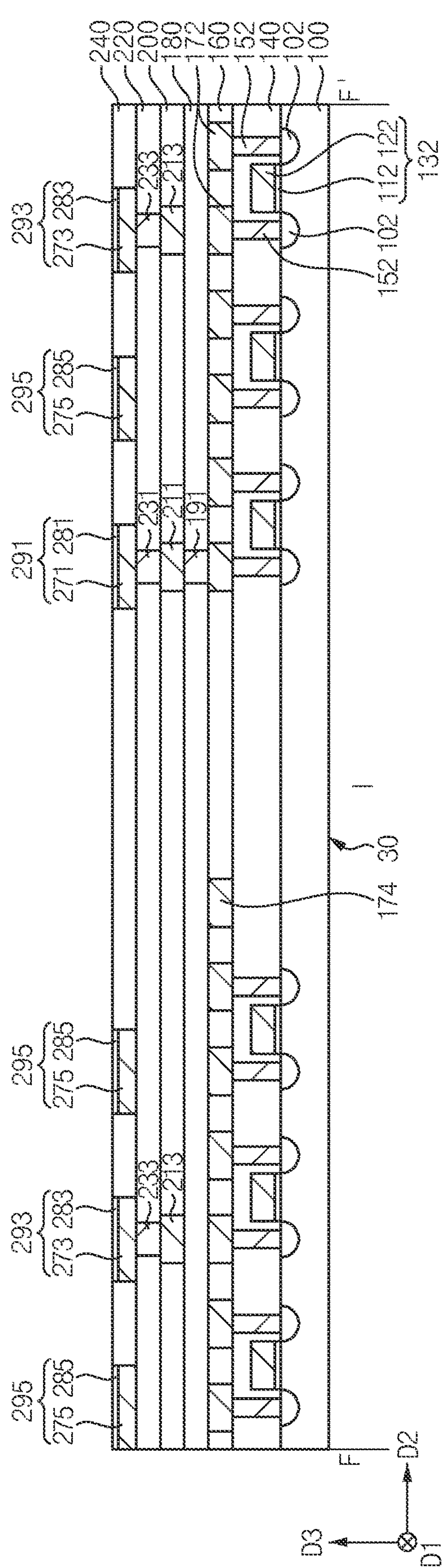
Figure 25:
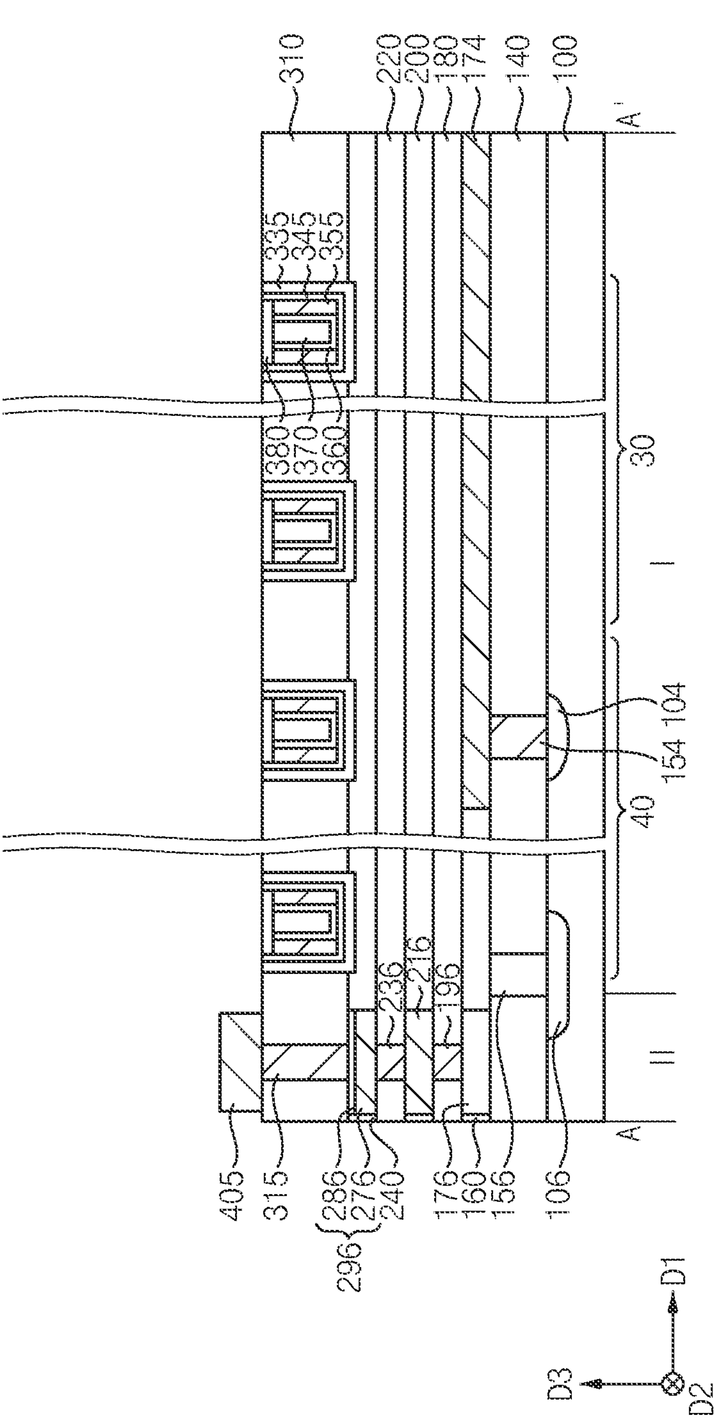
Figure 26:
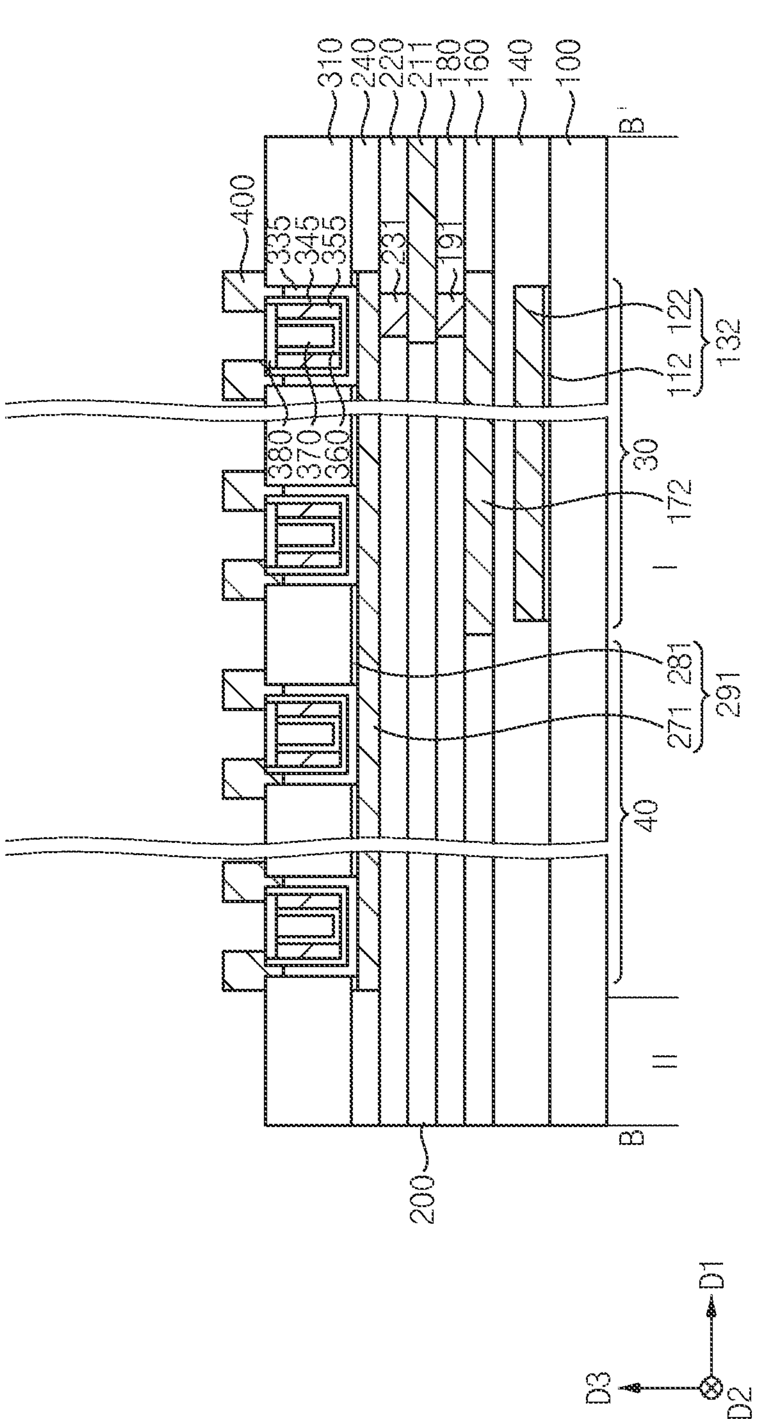
Figure 27:
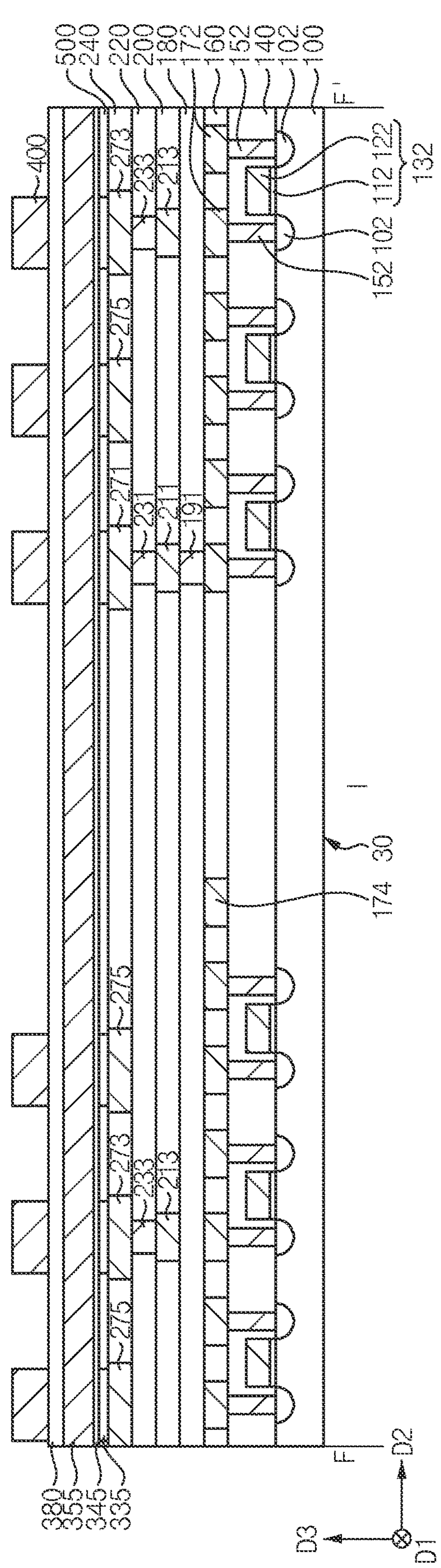

FIGS. 8 to 29 are plan views and cross-sectional views illustrating a method of manufacturing a semiconductor device in accordance with example embodiments. Particularly, FIGS. 8, 13, 17, 20, 22, 24 and 28 are the plan views, FIGS. 9, 14 and 25 are cross-sectional views taken along lines A-A' of corresponding plan views, respectively, FIGS. 10, 15, 18-19, 21, 23, 26 and 29 are cross-sectional views taken along lines B-B' of corresponding plan views, respectively, FIG. 11 includes cross-sectional views taken along lines C-C' and E-E' of a corresponding plan view, and FIGS. 12, 16 and 27 are cross-sectional views taken along lines F-F' of corresponding plan views, respectively.

Referring to FIGS. 8 to 12, first to third transistors may be formed on a substrate 100.

In example embodiments, the first transistor may be formed in a BLSA region 30, and the second transistor may be formed in a column circuit region 40. Additionally, the third transistor may be formed in the column circuit region 40 and the second region II. That is, at least a portion of the third transistor may be formed in the column circuit region 40, and other portions of the third transistor may be formed in the second region II.

The first transistor may include a first lower gate structure 132 and first impurity regions 102 at opposite sides, respectively, in the second direction D2 of the first lower gate structure 132, the second transistor may include a second lower gate structure 132 and second impurity regions 102 at opposite sides, respectively, in the second direction D2 of the second lower gate structure 132, and the third transistor may include a third lower gate structure 132 and third impurity regions 102 at opposite sides, respectively, in the second direction D2 of the third lower gate structure 132.

In an example embodiment, the first lower gate structure 132 may extend in the first direction D1 in the BLSA region 20. Alternatively, a plurality of first lower gate structures 132 may be spaced apart from each other in the first direction D1 in the BLSA region 30.

In example embodiments, a plurality of first lower gate structures 132 may be spaced apart from each other in the second direction D2 in the BLSA region 30, and thus a plurality of first transistors may be spaced apart from each other in the second direction D2 in the BLSA region 30.

Additionally, a plurality of second transistors may be spaced apart from each other in the first direction D1 or in the second direction D2 in the column circuit region 40, and a plurality of third transistors may be spaced apart from each other in the first direction D1 or in the second direction D2 in the column circuit region 40 and in the second region II.

A first lower insulating interlayer 140 may be formed on the substrate 100 to cover the first to third transistors. First to third lower contact plugs 152, 154 and 156 may be formed through the first lower insulating interlayer 140 to contact upper surfaces of the first to third impurity regions 102, 104 and 106, respectively, and fifth and sixth lower contact plugs 155 and 157 may be formed through the first lower insulating interlayer 140 to contact upper surfaces of the second and third lower gate structures 134 and 136, respectively. A fourth lower contact plug may be further formed through the first lower insulating interlayer 140 to contact an upper surface of the first lower gate structure 132.

A second insulating interlayer 160 may be formed on the first lower insulating interlayer 140, the first to third lower contact plugs 152, 154 and 156, and the fifth and sixth lower contact plugs 155 and 157, and first to fifth lower wirings 172, 174, 176, 175 and 177 may be formed through the second insulating interlayer 160 to contact upper surfaces of the first to third lower contact plugs 152, 154 and 156 and the fifth and sixth lower contact plugs 155 and 157.

In example embodiments, each of the first lower wirings 172 may be formed to extend in the first direction D1 in the BLSA region 30.

In example embodiments, at least one of the second lower wirings 174 on the second lower contact plugs 154, respectively, may extend in the first direction D1 in the column circuit region 40 and the BLSA region 30. Further, in an example embodiment, the at least one of the second lower wirings 174 may extend through the first and second mats 21 and 22 disposed in the first direction D1, and may continuously extend in the first direction D1.

In example embodiments, at least one of the third lower wirings 176 on the third lower contact plugs 156, respectively, may continuously extend in the first direction D1 from the column circuit region 40 to the second region II.

Referring to FIGS. 13 to 16, a third lower insulating interlayer 180 may be formed on the second insulating interlayer 160 and the first to fifth lower wirings 172, 174, 176, 175 and 177, and first and second lower vias 191 and 196 may be formed through the third lower insulating interlayer 180 to contact upper surfaces of the first and third lower wirings 172 and 176, respectively.

In example embodiments, the first lower via 191 may be formed on one of the first lower wirings 172 disposed in the second direction D2. Additionally, the second lower via 196 may be formed in the second region II.

A fourth lower insulating interlayer 200 may be formed on the third lower insulating interlayer 180 and the first and second lower vias 191 and 196. Sixth and eighth lower wirings 211 and 216 may be formed through the fourth lower insulating interlayer 200 to contact upper surfaces of the first and second lower vias 191 and 196, respectively, and a seventh lower wiring 213 may be formed through the fourth lower insulating interlayer 200 to overlap one of the first lower wirings 172 in the third direction D3.

In example embodiments, each of the sixth and seventh lower wirings 211 and 213 may extend in the first direction D1 not only in the BLSA region 30 included in the second mat 22, but also in the BLSA region 30 included in the first mat 21 adjacent in the first direction D1 and in portion of the first region I between the first and second mats 21 and 22. The seventh lower wiring 213 may contact an upper surface of the first lower via 191 in the BLSA region 30 included in the first mat 21 adjacent to the second mat 22 in the first direction D1.

Additionally, the eighth lower wiring 216 may be formed in the second region II.

A fifth lower insulating interlayer 220 may be formed on the fourth lower insulating interlayer 200 and the sixth to eighth lower wirings 211, 213 and 216. Third to fifth lower vias 231, 233 and 236 may be formed through the fifth lower insulating interlayer 220 to contact upper surfaces of the sixth to eighth lower wirings 211, 213 and 216, respectively.

In example embodiments, the fifth lower via 236 may be formed in the second region II.

First to third bit line structures 291, 293 and 295 and a first upper wiring structure 296 may be formed on the fifth lower insulating interlayer 220 and the third to fifth lower vias 231, 233 and 236, and a first opening may be formed between the first to third bit line structures 291, 293 and 295 and the first upper wiring structure 296 to expose an upper surface of the fifth lower insulating interlayer 220.

The first bit line structure 291 may include a first bit line 271 and a first insulation pattern 281 stacked in the third direction D3, the second bit line structure 293 may include a second bit line 273 and a second insulation pattern 283 stacked in the third direction D3, and the third bit line structure 295 may include a third bit line 275 and a third insulation pattern 285 stacked in the third direction D3. Additionally, the first upper wiring structure 296 may include a first upper wiring 276 and a fourth insulation pattern 286 stacked in the third direction D3.

In example embodiments, each of the first to third bit line structures 291, 293 and 295 may extend in the first direction D1 in the BLSA region 30 and the column circuit region 40. The first bit line structure 291 may contact an upper surface of the third lower via 231, and the second bit line structure 293 may contact an upper surface of the fourth lower via 233. The third bit line structure 295 may overlap in the third direction D3 one of the first lower wirings 172 that does not overlap in the third direction D3 the third lower via 231 or the fourth lower via 233.

The first upper wiring structure 296 may be formed in the second region II, and may contact an upper surface of the fifth lower via 236.

A first upper insulating interlayer may be formed on the first to third bit line structures 291, 293 and 295, the first upper wiring structure 296 and the fifth lower insulating interlayer 220 to fill the first opening, and an upper portion of the first upper insulating interlayer may be planarized until upper surfaces of the first to third bit line structures 291, 293 and 295 and the first upper wiring structure 296 are exposed, and thus a first upper insulating interlayer pattern 240 covering sidewalls of the first to third bit line structures 291, 293 and 295 and the first upper wiring structure 296 may be formed.

In example embodiments, the planarization process may include, e.g., a chemical mechanical polishing (CMP) process and/or an etch back process.

Figure 17:
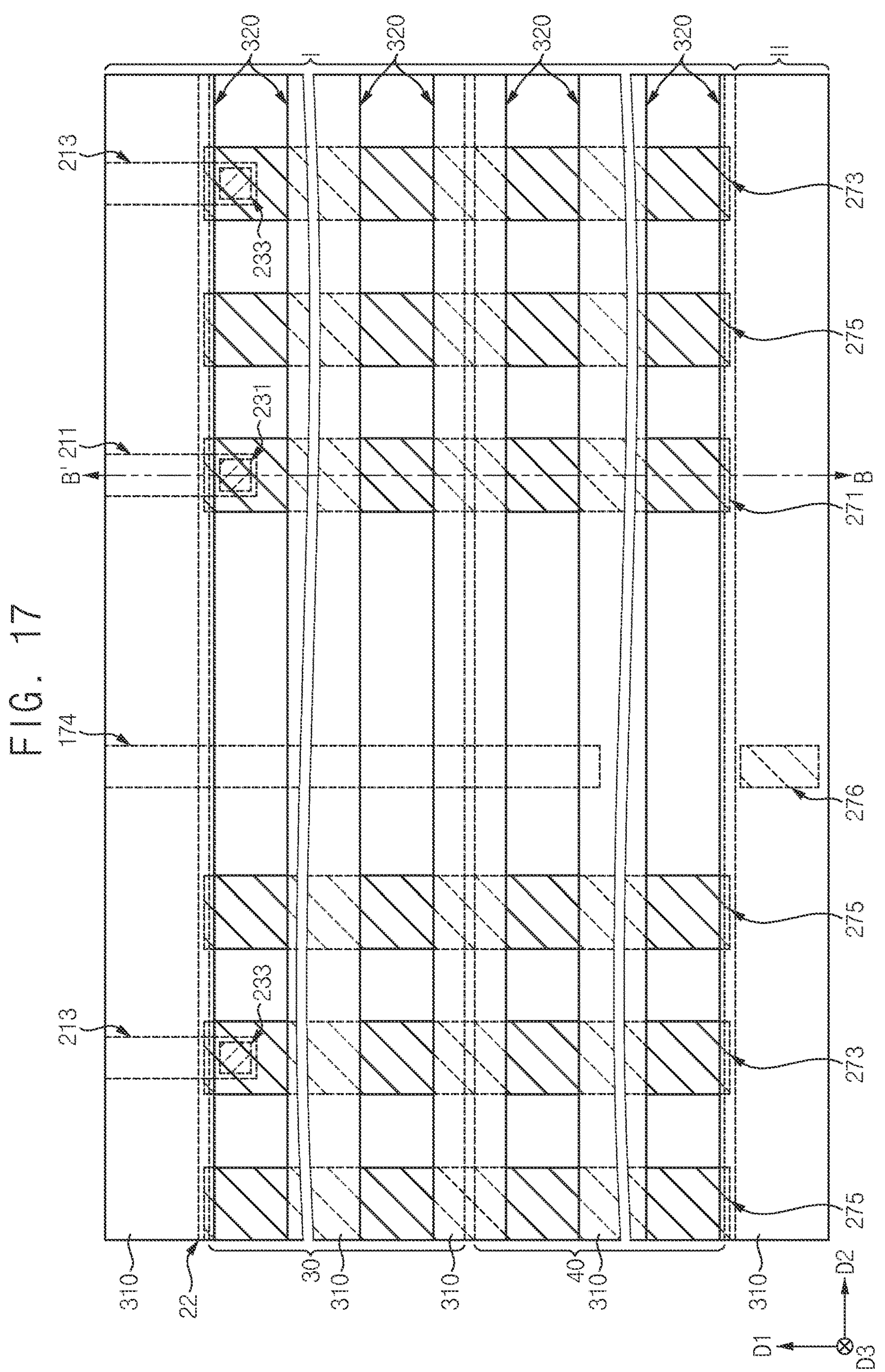
Figure 18:
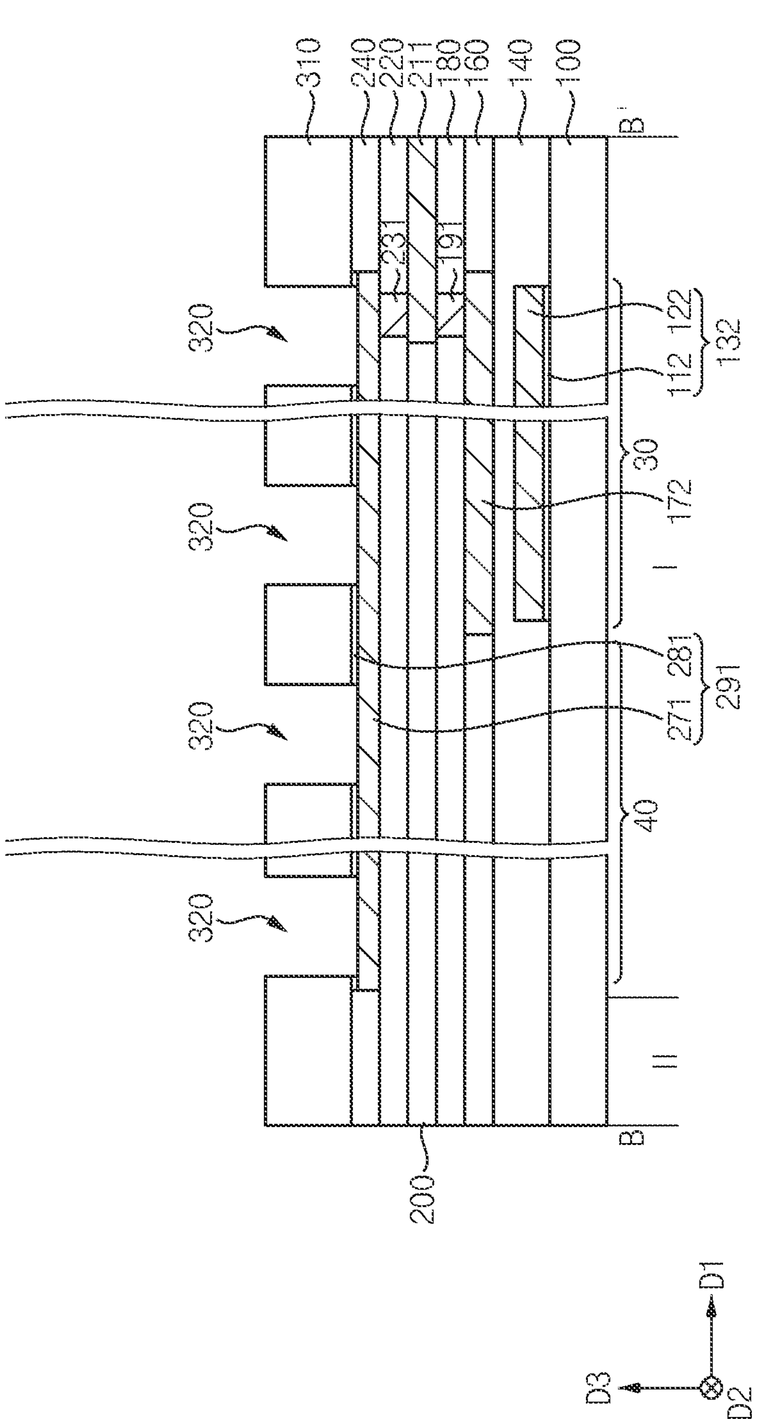

Referring to FIGS. 17 and 18, a second upper insulating interlayer may be formed on the first to third bit line structures 291, 293 and 295, the first upper wirings structure 296 and the first upper insulating interlayer pattern 240, and the second upper insulating interlayer and the first to third insulation patterns 281, 283 and 285 may be partially removed by, e.g., a dry etching process to form a second opening 320 extending in the second direction D2 and exposing upper surfaces of the first to third bit lines 271, 273 and 275 and the first upper insulating interlayer pattern 240 in the BLSA region 30 and the column circuit region 40.

Thus, the second upper insulating interlayer may be divided into a plurality of second upper insulating interlayer patterns 310 spaced apart from each other in the first direction D1, and each of the second upper insulating interlayer patterns 310 may extend in the second direction D2.

Figure 19:
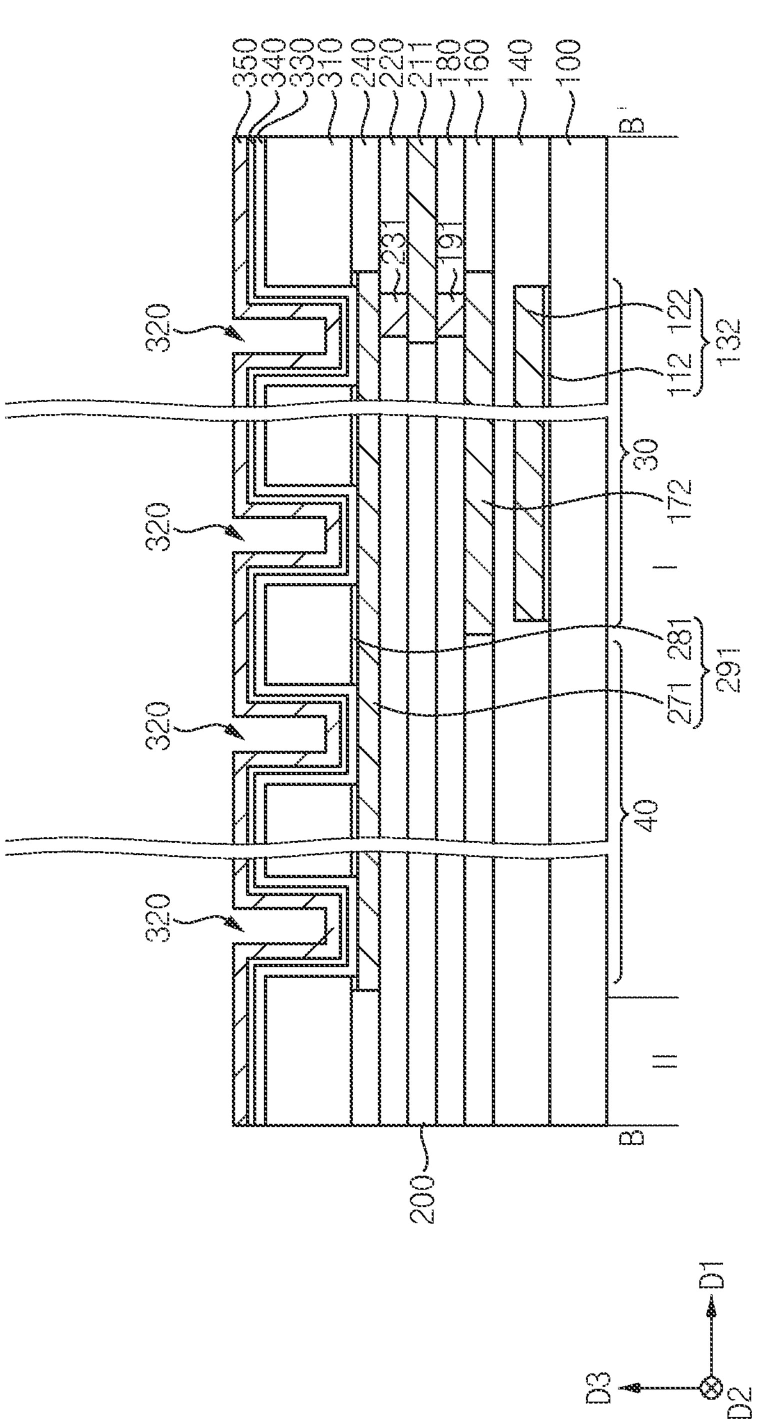

Referring to FIG. 19, a channel layer 330, an upper gate insulation layer 340 and an upper gate electrode layer 350 may be sequentially stacked on the upper surfaces of the first to third bit lines 271, 273 and 275 and the first upper insulating interlayer pattern 240, and a sidewall and an upper surface of the second insulating interlayer pattern 310.

In example embodiments, the channel layer 330, the upper gate insulation layer 340 and the upper gate electrode layer 350 may be formed by a deposition process, e.g., an atomic layer deposition (ALD) process, a chemical vapor deposition (CVD) process, etc.

In example embodiments, the channel layer 330 may include a oxide semiconductor material, e.g., IGZO, and may be formed at a relatively low temperature, while the upper gate insulation layer 340 and the upper gate electrode layer 350 may be formed at a relatively high temperature.

Figure 20:
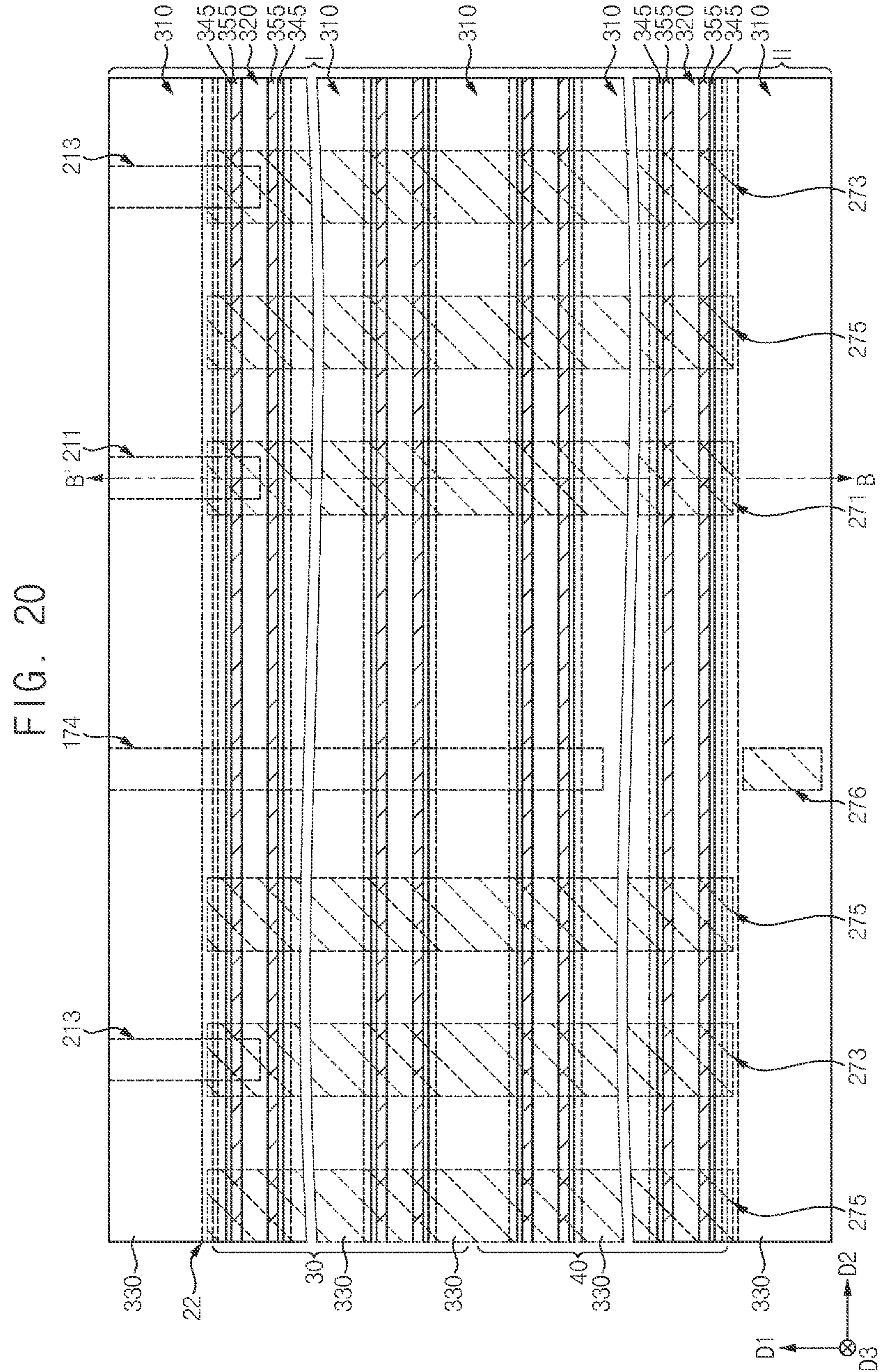
Figure 21:
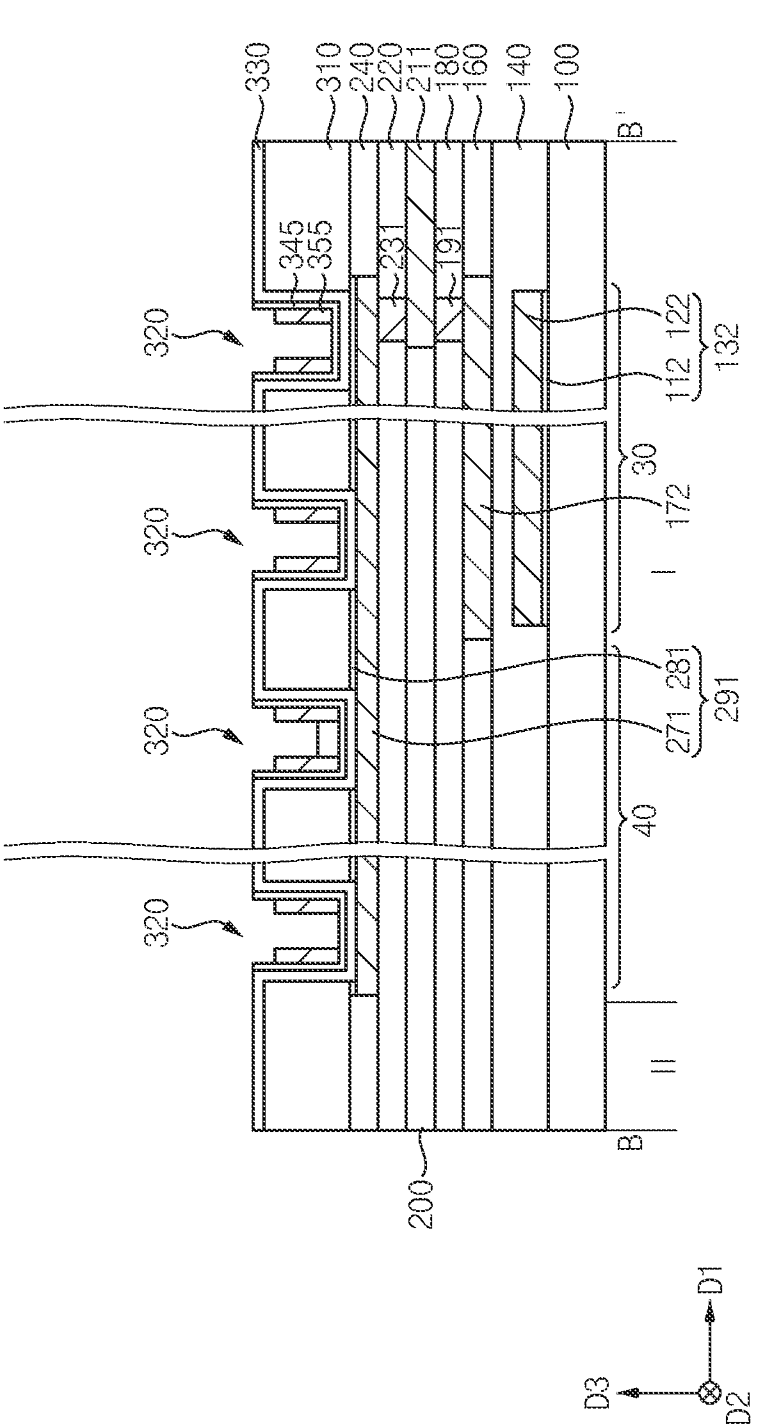

Referring to FIGS. 20 and 21, the upper gate electrode layer 350 and the upper gate insulation layer 340 may be anisotropically etched to form an upper gate electrode 355 and an upper gate insulation pattern 345, respectively, on a sidewall of a portion of the channel layer 330 in the second opening 320.

An outer sidewall and a lower surface of the upper gate insulation pattern 345 may contact an inner sidewall and an inner lower surface of the portion of the channel layer 330 in the second opening 320. In example embodiments, a cross-section in the first direction D1 of the upper gate insulation pattern 345 may have a shape of a cup. Alternatively, a cross-section in the first direction D1 of the upper gate insulation pattern 345 may have an “L” shape.

The upper gate electrode 355 may contact an inner sidewall of the upper gate insulation pattern 345, and may contact an inner lower surface of the upper gate insulation pattern 345 in the second opening 320.

For example, an etch back process may be performed to remove an upper portion of the upper gate electrode 355. Thus, an upper surface of the upper gate electrode 355 may be lower than an upper surface of the gate insulation pattern 345, and an upper inner sidewall of the upper gate insulation pattern 345 may be exposed. In example embodiments, the upper surface of the upper gate electrode 355 may be lower than an upper surface of the second upper insulating interlayer pattern 310.

Figure 22:
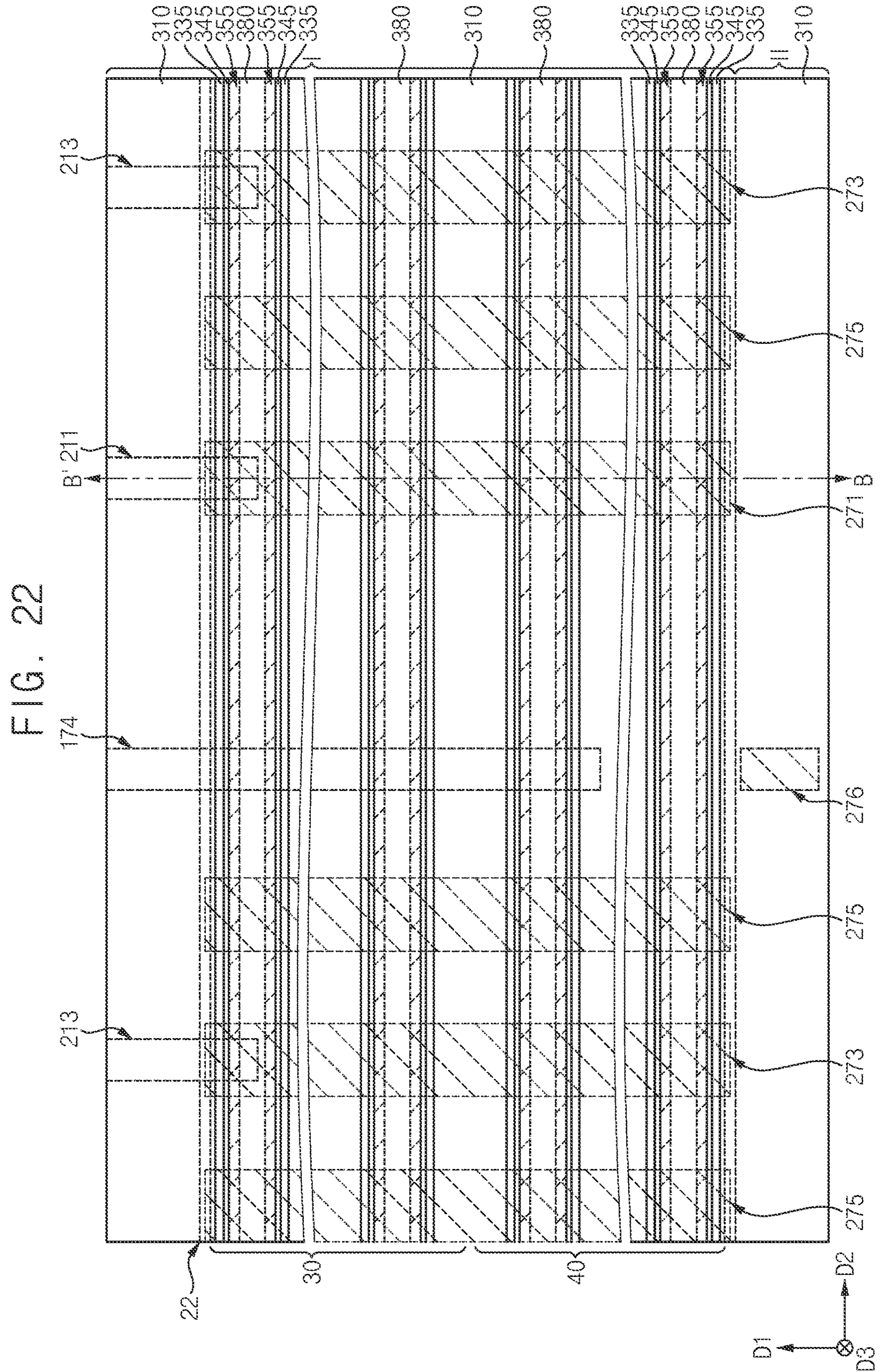
Figure 23:
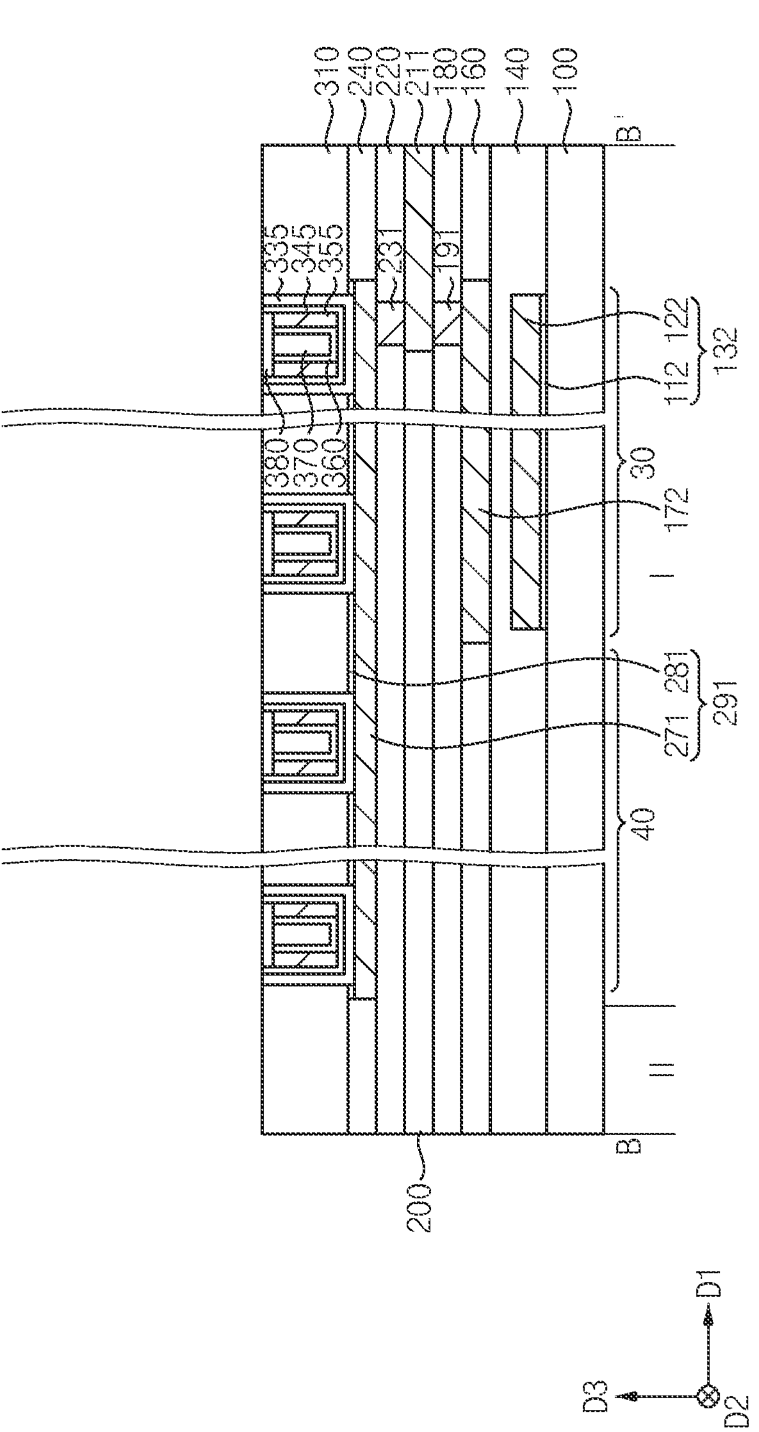
Figure 24:
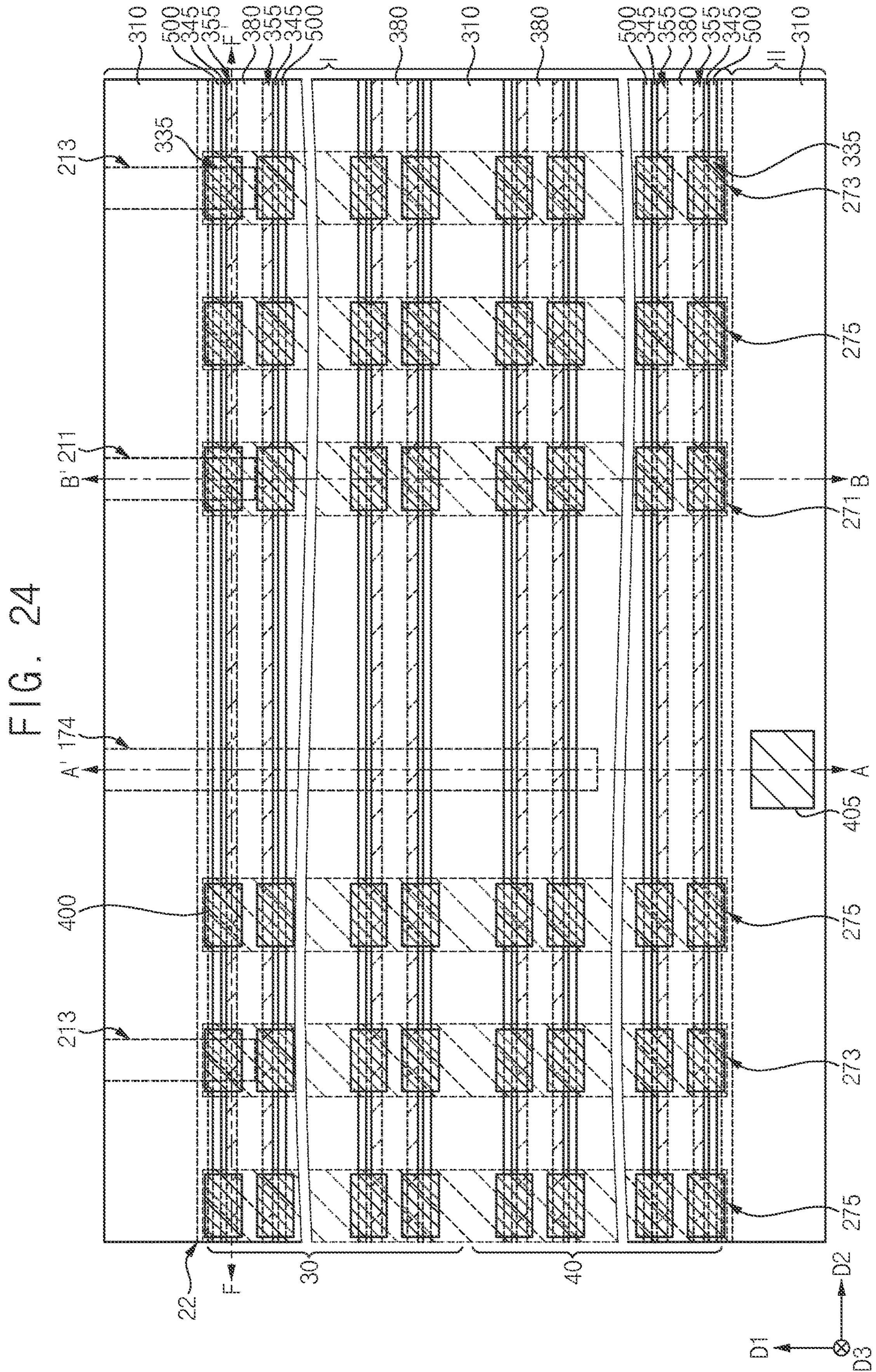

Referring to FIGS. 22 and 23, a fifth insulation layer may be formed on the upper surface and a sidewall of the upper gate electrode 355, the upper inner sidewall and the upper surface of the upper gate insulation pattern 345, and an upper surface of the channel layer 330, a third upper insulating interlayer may be formed on the fifth insulation layer to fill a remaining portion of the second opening 320, and the third upper insulating interlayer, the fifth insulation layer, the upper gate insulation pattern 345 and the channel layer 330 may be planarized until the upper surface of the second insulating interlayer pattern 310 is exposed.

The planarization process may include, e.g., a CMP process and/or an etch back process.

As the planarization process is performed, a third insulating interlayer pattern 370 and a fifth insulation pattern 360 covering a lower surface and a sidewall of the third insulating interlayer pattern 370 may be formed in the second opening 320, and the channel layer 330 may be divided into a plurality of channels 335 spaced apart from each other in the first direction D1. In example embodiments, each of the channels 335 may extend in the second direction D2, and a cross-section in the first direction D1 of the channel 335 may have a shape of a cup.

Upper portions of the third upper insulating interlayer pattern 370 and the fifth insulation pattern 360 may be removed to form a first recess exposing the upper surface of the upper gate electrode 355, and a sixth insulation pattern 380 may be formed in the first recess.

The sixth insulation pattern 380 may be formed by forming a sixth insulation layer on the upper gate electrode 355, the third upper insulating interlayer pattern 370, the fifth insulation pattern 360, the upper gate insulation pattern 345, the channel 335 and the second upper insulating interlayer pattern 310 to fill the first recess, and planarizing the sixth insulation layer until the upper surface of the second upper insulating interlayer pattern 310 is exposed.

A first upper contact plug 315 (refer to FIG. 25) may be formed through the second upper insulating interlayer pattern 310 and the fourth insulation pattern 286 to contact an upper surface of the first upper wiring 276 in the second region II.

Referring to FIGS. 24 to 27, the channel 335 may be partially removed to form a third opening exposing upper surfaces of the first to third bit lines 271, 273 and 275 and the first insulating interlayer pattern 240, and a seventh insulation pattern 500 may be formed in the third opening. Thus, the channel 335 extending in the second direction D2 may be divided into a plurality of parts spaced apart from each other in the second direction D2. As a result, a plurality of channels 335 may be spaced apart from each other in the first and second directions D1 and D2.

An upper portion of the channel 335 may be removed to form a second recess, and a first landing pad 400 may be formed on the channel 335, the upper gate insulation pattern 345, the sixth insulation pattern 380 and the second upper insulating interlayer pattern 310 to fill the second recess 390.

In example embodiments, a plurality of first landing pads 400 may be spaced apart from each other in the BLSA region 30 and the column circuit region 40.

In an example embodiment, the first landing pads 400 may be arranged in a lattice pattern in a plan view. Alternatively, the first landing pads 400 may be arranged in a honeycomb pattern in a plan view.

A second landing pad 405 may be formed in the second region II, and may contact an upper surface of the first upper contact plug 315.

Figure 28:
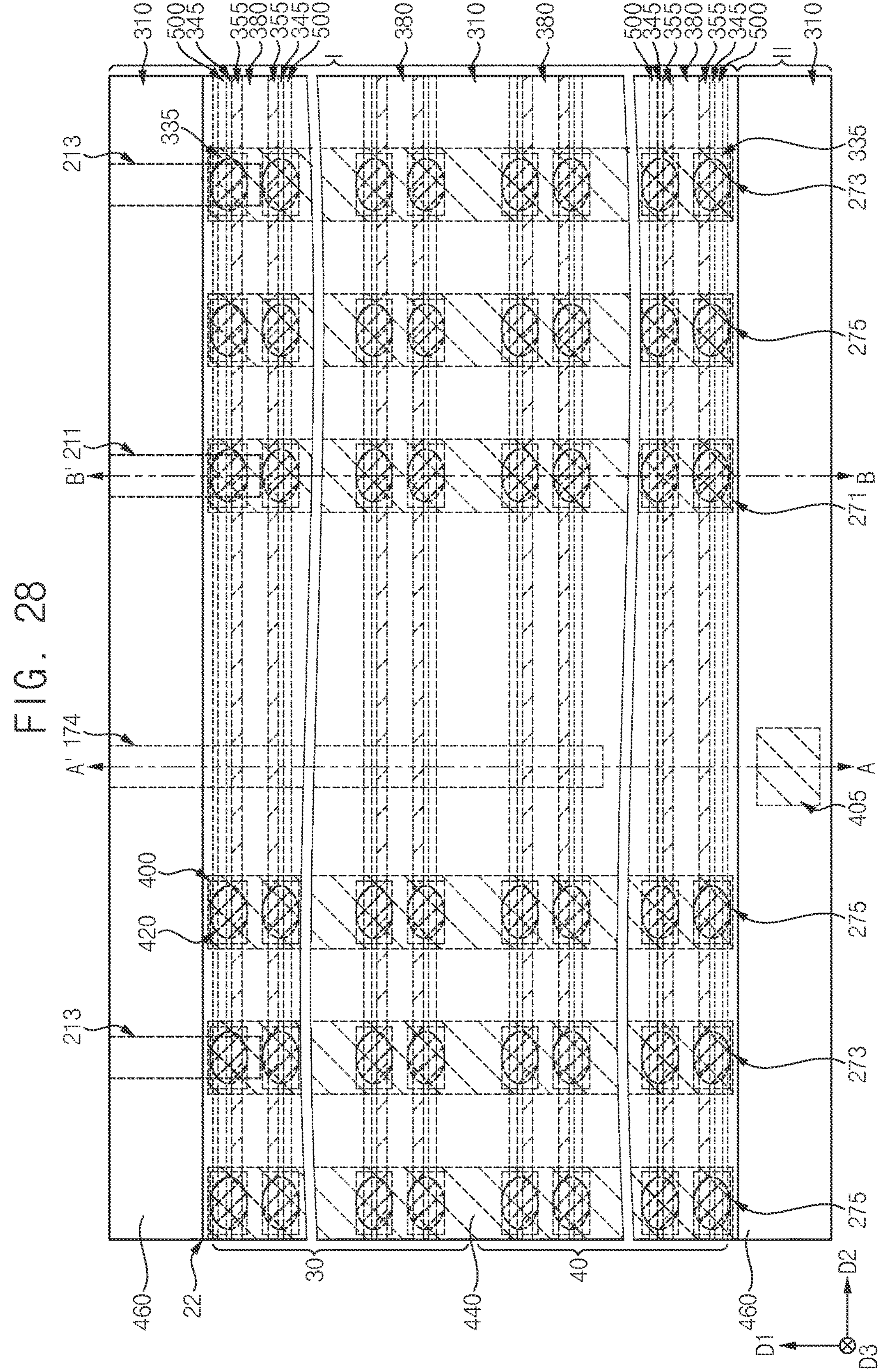
Figure 29:
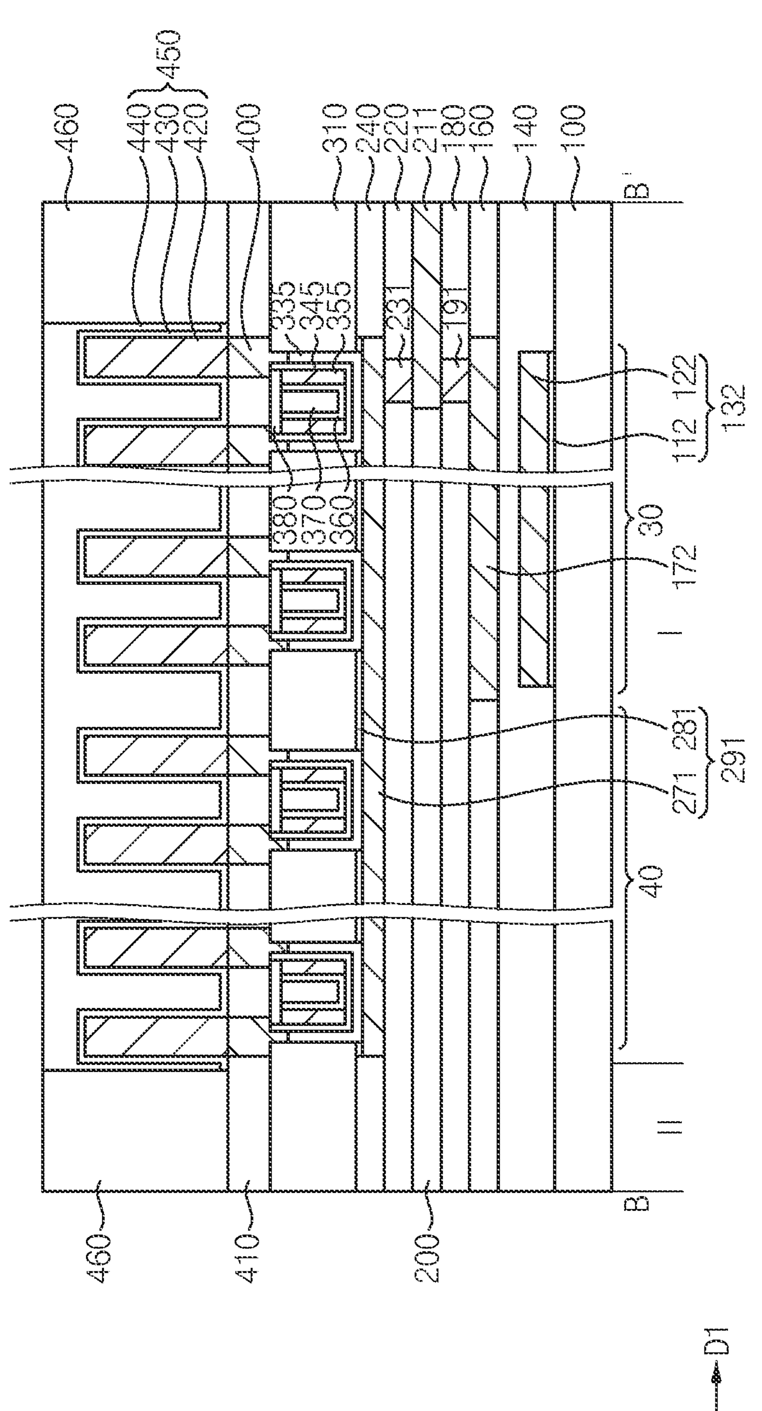

Referring to FIGS. 28 and 29, a fourth insulating interlayer may be formed on the second upper insulating interlayer pattern 310, the channel 335, the upper gate insulation pattern 345, and the sixth and seventh insulation patterns 380 and 500 to cover the first and second landing pads 400 and 405, and may be planarized until upper surfaces of the first and second landing pads 400 and 405 are exposed to form a fourth upper insulating interlayer pattern 410 covering sidewalls of the first and second landing pads 400 and 405.

A first capacitor electrode 420 may be formed to contact the upper surface of the first landing pad 400, a dielectric layer 430 may be formed on an upper surface and a sidewall of the first capacitor electrode 420 and an upper surface of the fourth insulating interlayer pattern 410, and a second capacitor electrode 440 may be formed on a surface of the dielectric layer 430 to form a capacitor 450.

Portions of the second capacitor electrode 440 and the dielectric layer 430 in other regions except for the first and second mats 21 and 22, that is, in the second region II and a portion of the first region I between the first and second mats 21 and 22 may be removed to form a fourth opening exposing the upper surface of the fourth insulating interlayer pattern 410, and a fifth upper insulating interlayer pattern 460 may be formed in the fourth opening.

Referring to FIGS. 3 to 7 again, a sixth upper insulating interlayer 470 may be formed on the capacitor 450 and the fifth upper insulating interlayer pattern 460, and a second upper contact plug 485 may be formed through the sixth upper insulating interlayer 470 and the fifth upper insulating interlayer pattern 460 in the second region II to contact the upper surface of the second landing pad 405.

A seventh upper insulating interlayer 490 may be formed on the sixth upper insulating interlayer 470 and the second upper contact plug 485, and a second upper wiring 505 may be formed through the seventh upper insulating interlayer 490 to contact an upper surface of the second upper contact plug 485.

An eighth upper insulating interlayer 510 may be formed on the seventh upper insulating interlayer 490 and the second upper wiring 505, and a first upper via 525 may be formed through the eighth upper insulating interlayer 510 to contact an upper surface of the second upper wiring 505.

A ninth upper insulating interlayer 530 may be formed on the eighth upper insulating interlayer 510 and the first upper via 525, and a third upper wiring 545 may be formed through the ninth upper insulating interlayer 530 to contact an upper surface of the first upper via 525.

In example embodiments, the third upper wiring 545 may extend in the first direction D1 in the second region II, the column circuit region 40 and the BLSA region 30, and further, may extend through the first and second mats 21 and 22 disposed in the first direction D1 to continuously extend in the first direction D1.

By the above processes, the fabrication of the semiconductor device may be completed.

Figure 30:
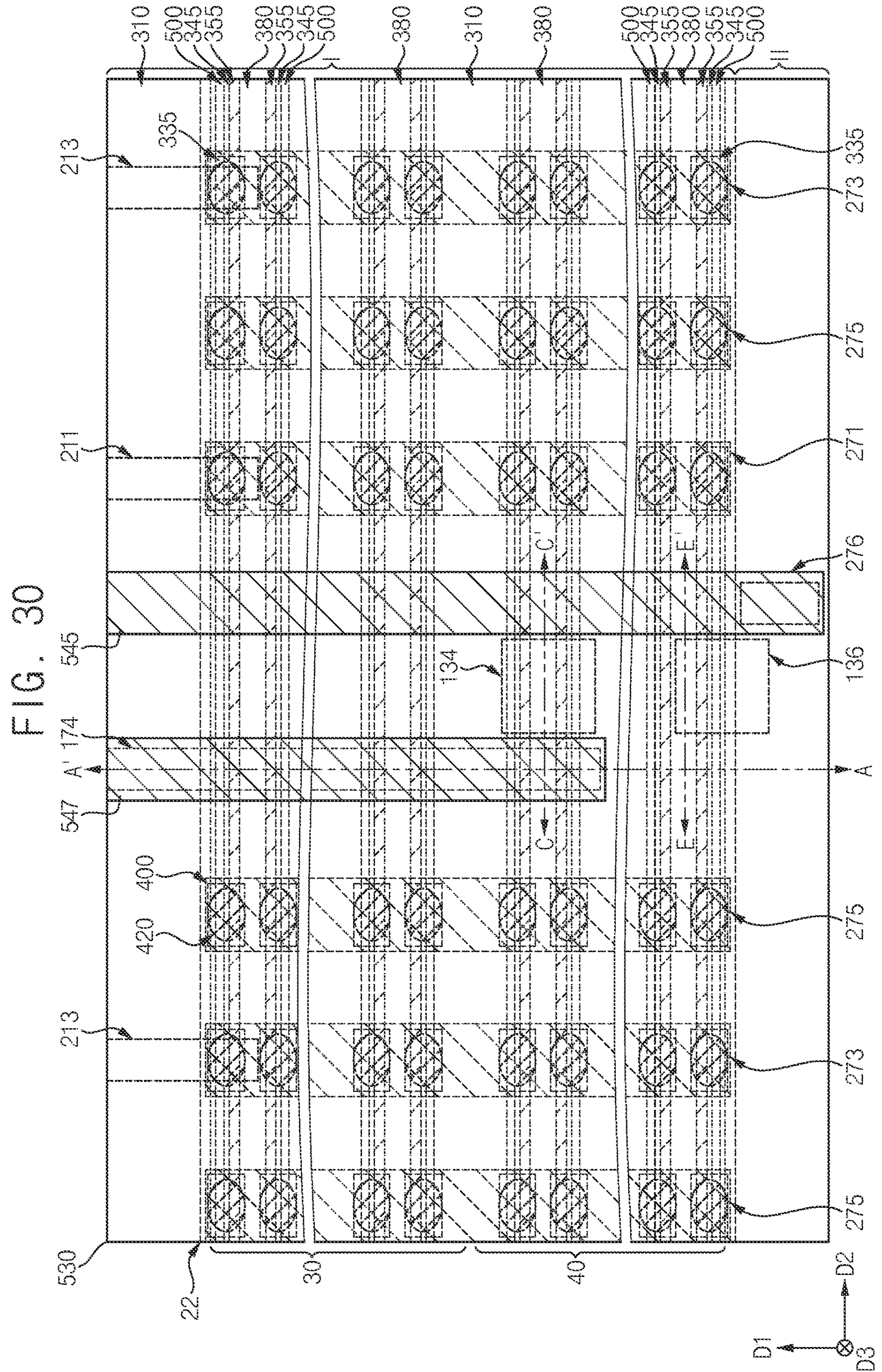
FIGS. 30, 31, and 32 are a plan view and cross-sectional views illustrating a semiconductor device in accordance with example embodiments.
Figure 31:
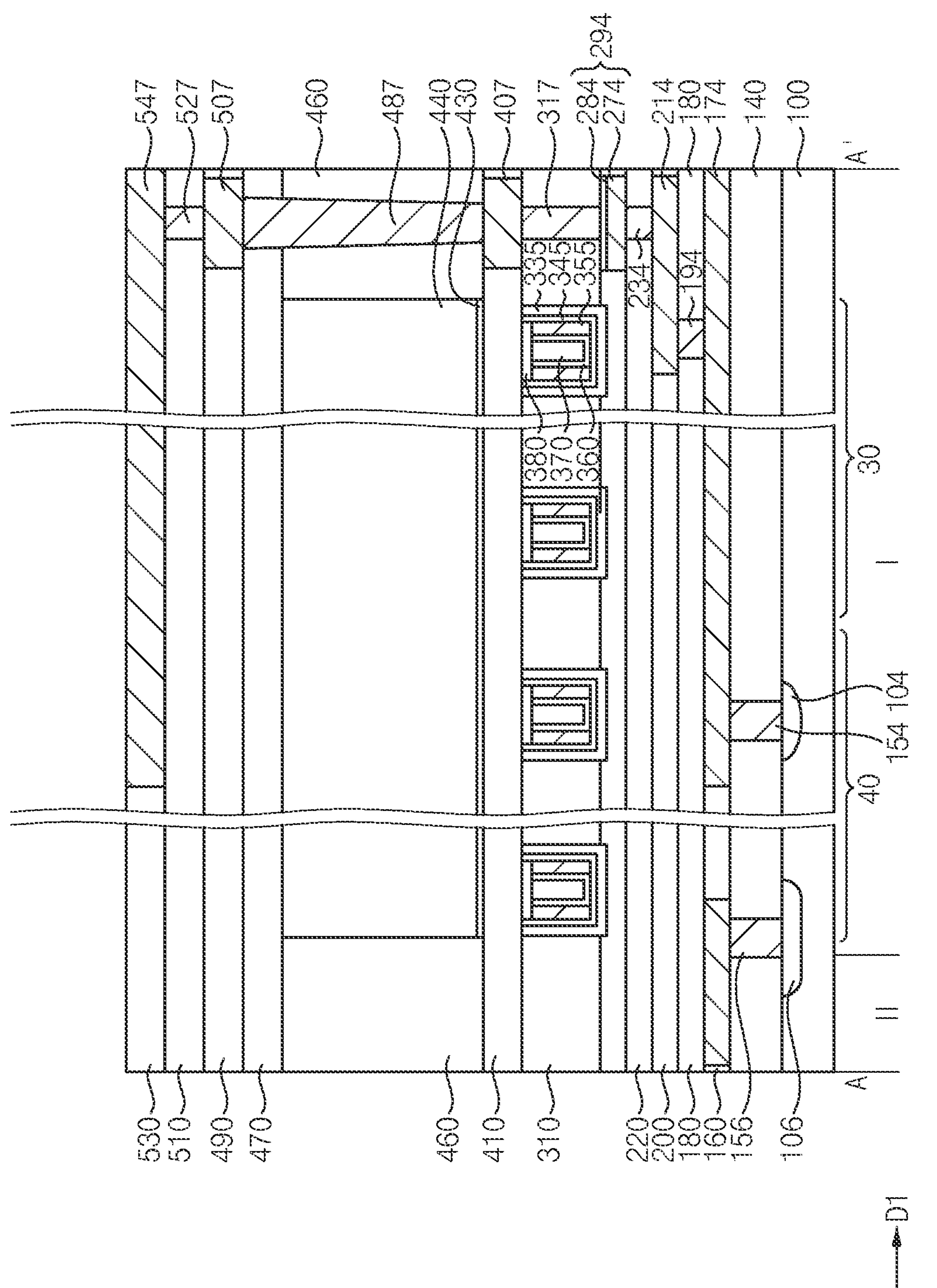
Figure 32:
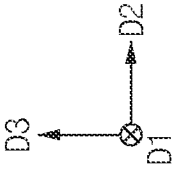

FIGS. 30 to 32 are a plan view and cross-sectional views illustrating a semiconductor device in accordance with example embodiments.

FIG. 30 is the plan view, FIG. 31 is a cross-sectional view taken along line A-A' of FIG. 30, and FIG. 32 includes cross-sectional views taken along lines C-C' and E-E', respectively, of FIG. 30.

This semiconductor device may be substantially the same as or similar to that of FIGS. 1 to 7, and thus repeated explanations are omitted herein.

Referring to FIGS. 30 to 32, the semiconductor device may further include a fourth upper wiring 547 continuously extending in the first direction D1 through the ninth upper insulating interlayer 530 in the first and second mats 21 and 22.

The fourth upper wiring 547 may be electrically connected to the second lower wiring 174 serving as a CSL in each of the first and second mats 21 and 22 through the second upper via 527, the sixth upper wiring 507, the fifth upper contact plug 487, the third landing pad 407, the fourth upper contact plug 317, the fifth upper wiring 274, the seventh lower via 234, the ninth lower wiring 214 and the sixth lower via 194 that are formed in a portion of the first region I between the first and second mats 21 and 22 neighboring in the first direction D1.

That is, the fourth upper wiring 547 may be commonly electrically connected to the second lower wirings 174 each of which may extend in the first direction D1 and serve as the CSL in each of the first and second mats 21 and 22, and may serve as a global CSL for applying electric signals to the second lower wirings 174.

Figure 33:
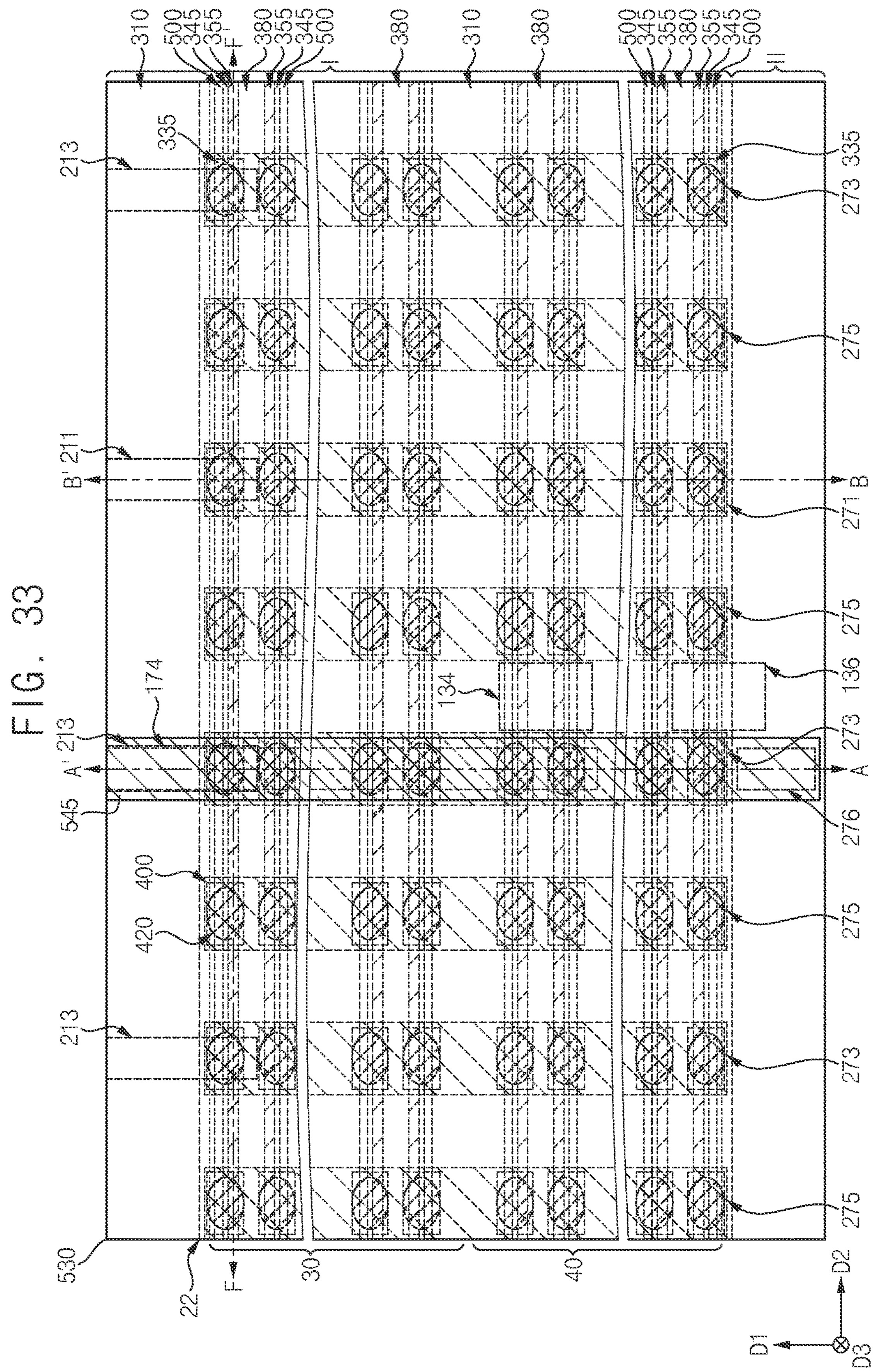
FIGS. 33 and 34 are a plan view and a cross-sectional view illustrating a semiconductor device in accordance with example embodiments.
Figure 34:
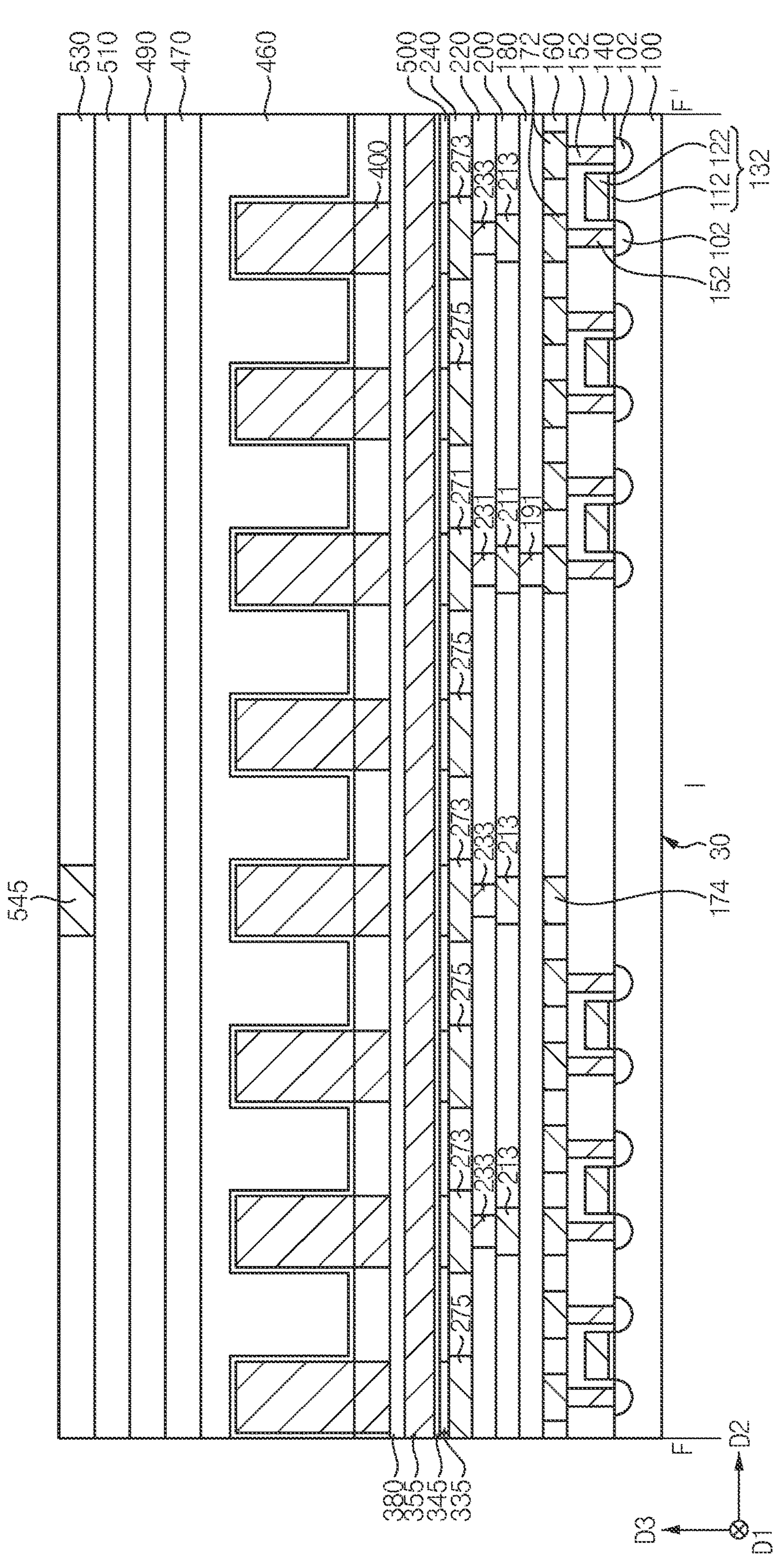

FIGS. 33 and 34 are a plan view and a cross-sectional view illustrating a semiconductor device in accordance with example embodiments.

Particularly, FIG. 33 is the plan view, and FIG. 34 is a cross-sectional view taken along line F-F' of FIG. 33.

This semiconductor device may be substantially the same as or similar to that of FIGS. 1 to 7, and thus repeated explanations are omitted herein.

Referring to FIGS. 33 and 34, more bit lines may be formed on the second transistor composing a CSL driver circuit pattern and the second lower wiring 174 serving as a CSL, and may overlap, e.g., the second lower wiring 174 in the third direction D3.

FIGS. 33 and 34 show additional second and third bit lines 273 and 275 in addition to the first to third bit lines 271, 273 and 275 shown in FIGS. 1 to 7.

While the present inventive concepts have been shown and described with reference to example embodiments thereof, it will be understood by those of ordinary skill in the art that various changes in form and details may be made thereto without departing from the scope of the present inventive concepts as set forth by the following claims.

What is claimed is:

1. A semiconductor device comprising:
- a bit line sense amplifier (BLSA) circuit pattern on a substrate;
- a column circuit pattern on the substrate adjacent to the BLSA pattern; and
- a cell array including:
  - bit lines on the BLSA circuit pattern and the column circuit pattern, each of the bit lines extending in a first direction and spaced apart from each other in a second direction crossing the first direction;
  - gate electrodes spaced apart from each other in the first direction, each of the gate electrodes extending in the second direction on the bit lines;
  - a gate insulation pattern on a sidewall in the first direction of each of the gate electrodes;
  - a channel on a sidewall in the first direction of the gate insulation pattern, the channel contacting a corresponding one of the bit lines;
  - a landing pad on the channel, where the gate insulation pattern extends to a sidewall of a lower portion of the landing pad; and
  - a capacitor on the landing pad,
- wherein the BLSA circuit pattern and the column circuit pattern overlap the cell array in a third direction substantially perpendicular to the first and second directions.

2. The semiconductor device according to claim 1, wherein the column circuit pattern includes at least one of a column decoder, a column select line (CSL) driver, an input/output sense amplifier (I/O SA), or a write driver.

3. The semiconductor device according to claim 2, wherein the column circuit pattern includes the CSL driver, and
- wherein the semiconductor device further comprises a CSL extending in the first direction under the cell array, the CSL being electrically connected to the CSL driver.

4. The semiconductor device according to claim 2, wherein the column circuit pattern includes the I/O SA, and wherein the semiconductor device further comprises a global I/O line extending in the first direction over the cell array, the global I/O line being electrically connected to the I/O SA.

5. The semiconductor device according to claim 1, wherein:

mats are arranged in the first direction on a bank region of the substrate, wherein the cell array is one of a plurality of cell arrays, and each of the mats includes a respective cell array among the plurality of cell arrays, the mats include first mats and second mats, the second mats being at opposite end portions of the bank region in the first direction, and the column circuit pattern is in at least one of the second mats.

6. The semiconductor device according to claim 5, wherein the BLSA circuit patterns are at opposing first side portions, respectively, in the first direction of each of the first mats, and wherein the BLSA circuit pattern and the column circuit pattern are at opposing second side portions, respectively, in the first direction of each of the second mats, and the column circuit pattern is between the BLSA circuit pattern and a peripheral circuit region of the substrate.

7. The semiconductor device according to claim 5, wherein the column circuit pattern includes a column select line (CSL) driver, and wherein the semiconductor device further comprises a CSL extending in the first direction through the first and second mats under the cell array, the CSL being electrically connected to the CSL driver.

8. The semiconductor device according to claim 7, further comprising a global CSL continuously extending through the first and second mats in the first direction over the cell array, the global CSL being electrically connected to the CSL.

9. The semiconductor device according to claim 5, wherein the column circuit pattern includes an input/output sense amplifier (I/O SA), and wherein the semiconductor device further comprises a global I/O line continuously extending through the first and second mats in the first direction over the cell array, the global I/O line being electrically connected to the I/O SA.

10. The semiconductor device according to claim 9, wherein the I/O SA partially overlaps the cell array in the third direction, and wherein the I/O SA and the global I/O line are electrically connected to each other through a conductive structure in an area that is not overlapping the cell array in the third direction.

11. A semiconductor device comprising:

mats arranged in a first direction on a substrate;

a bit line sense amplifier (BLSA) circuit pattern in each of the mats; and a cell array on the BLSA circuit pattern in each of the mats, the cell array including:

bit lines spaced apart from each other in a second direction crossing the first direction, each of the bit lines extending in the first direction;

gate electrodes spaced apart from each other in the first direction, each of the gate electrodes extending in the second direction on the bit lines;

a gate insulation pattern on a sidewall in the first direction of each of the gate electrodes;

a channel on a sidewall in the first direction of the gate insulation pattern, the channel contacting a corresponding one of the bit lines;

a landing pad on the channel, where the gate insulation pattern extends to a sidewall of a lower portion of the landing pad; and a capacitor on the landing pad, wherein the mats include first mats and second mats, the second mats being at opposite end portions, respectively, in the first direction, and wherein the semiconductor device further comprises a column circuit pattern under the cell array in each of the second mats, the column circuit pattern overlapping the cell array in a third direction that is substantially perpendicular to the first and second directions.

12. The semiconductor device according to claim 11, wherein the mats are on a bank region of the substrate, wherein the BLSA circuit patterns are at opposing first side portions, respectively, in the first direction of each of the first mats, and wherein the BLSA circuit pattern and the column circuit pattern are at opposing second side portions, respectively, in the first direction of each of the second mats, and the column circuit pattern is between the BLSA circuit pattern and a peripheral circuit region of the substrate.

13. The semiconductor device according to claim 11, wherein the column circuit pattern includes at least one of a column decoder, a column select line (CSL) driver, an input/output sense amplifier (I/O SA), or a write driver.

14. The semiconductor device according to claim 13, wherein the column circuit pattern includes the CSL driver, and wherein the semiconductor device further comprises a CSL continuously extending in the first direction through the first and second mats under the cell array, the CSL being electrically connected to the CSL driver.

15. The semiconductor device according to claim 14, further comprising a global CSL continuously extending in the first direction through the first and second mats over the cell array, the global CSL being electrically connected to the CSL.

16. The semiconductor device according to claim 13, wherein the column circuit pattern includes the I/O SA, and wherein the semiconductor device further comprises a global I/O line continuously extending in the first direction through the first and second mats over the cell array, the global I/O line being electrically connected to the I/O SA.

17. The semiconductor device according to claim 16, wherein the I/O SA partially overlaps the cell array in the third direction, and wherein the I/O SA and the global I/O line are electrically connected to each other through a conductive structure in an area that is not overlapping the cell array in the third direction.

18. A semiconductor device comprising:

first and second mats on a bank region of a substrate, the substrate including the bank region and a peripheral circuit region, the first and second mats being arranged on the bank region in first and second directions crossing each other;

first bit line sense amplifier (BLSA) circuit patterns at opposing first side portions, respectively, in the first direction in each of the first mats;

a first cell array on the first BLSA circuit patterns in each of the first mats, wherein the first cell array includes:

gate electrodes spaced apart from each other in the first direction, each of the gate electrodes extending in the second direction on the bit lines;

a gate insulation pattern on a sidewall in the first direction of each of the gate electrodes;

a channel on a sidewall in the first direction of the gate insulation pattern, the channel contacting a corresponding one of the bit lines;

a landing pad on the channel, where the gate insulation pattern extends to a sidewall of a lower portion of the landing pad; and a capacitor on the landing pad;

a second BLSA circuit pattern and a column circuit pattern at opposing second side portions, respectively, in the first direction in each of the second mats; and a second cell array on the second BLSA circuit pattern and the column circuit pattern in each of the second mats, wherein the column circuit pattern overlaps the second cell array in a third direction that is substantially perpendicular to the first and second directions.

19. The semiconductor device according to claim 18, wherein each of the second mats is arranged adjacent to the peripheral circuit region in the first direction such that the column circuit pattern is between the second BLSA circuit pattern and the peripheral circuit region.

20. The semiconductor device according to claim 18, wherein the column circuit pattern includes at least one of a column decoder, a column select line (CSL) driver, an input/output sense amplifier (I/O SA), or a write driver.

* * * * *